United States Patent
Tsurume et al.

(10) Patent No.: US 8,698,262 B2
(45) Date of Patent: Apr. 15, 2014

(54) WIRELESS CHIP AND MANUFACTURING METHOD OF THE SAME

(75) Inventors: Takuya Tsurume, Atsugi (JP); Koji Dairiki, Isehara (JP); Naoto Kusumoto, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1090 days.

(21) Appl. No.: 11/213,997

(22) Filed: Aug. 30, 2005

(65) Prior Publication Data

US 2006/0055014 A1 Mar. 16, 2006

(30) Foreign Application Priority Data

Sep. 14, 2004 (JP) ................................. 2004-267415

(51) Int. Cl.
*H01L 21/14* (2006.01)

(52) U.S. Cl.
USPC ........... 257/428; 257/682; 257/729; 257/789; 257/790; 257/791; 257/792; 257/793

(58) Field of Classification Search
None
See application file for complete search history.

(56) References Cited

U.S. PATENT DOCUMENTS

| | | | | |
|---|---|---|---|---|
| 3,807,384 A * | 4/1974 | Schach et al. | ................ | 126/680 |
| 3,925,726 A * | 12/1975 | Few | ................ | 324/72 |
| 4,717,948 A * | 1/1988 | Sakai et al. | ................ | 257/786 |
| 5,074,951 A | 12/1991 | Banco et al. | | |
| 5,279,693 A | 1/1994 | Robinson et al. | | |
| 5,323,150 A | 6/1994 | Tuttle | | |
| 5,485,671 A * | 1/1996 | Larson et al. | ............ | 29/890.032 |
| 5,506,401 A * | 4/1996 | Segawa et al. | ............. | 250/208.1 |
| 5,622,304 A * | 4/1997 | Sato | ............. | 228/44.7 |
| 5,720,338 A * | 2/1998 | Larson et al. | ............. | 165/46 |
| 5,786,589 A * | 7/1998 | Segawa et al. | ............. | 250/208.1 |
| 5,936,014 A * | 8/1999 | Voigt et al. | ............. | 524/51 |
| 6,018,299 A | 1/2000 | Eberhardt | | |
| 6,045,882 A * | 4/2000 | Sandford | ............. | 428/34.9 |
| 6,091,332 A | 7/2000 | Eberhardt et al. | | |
| 6,096,431 A | 8/2000 | Matsudaira et al. | | |
| 6,107,920 A | 8/2000 | Eberhardt et al. | | |
| 6,130,613 A | 10/2000 | Eberhardt et al. | | |

(Continued)

FOREIGN PATENT DOCUMENTS

| | | |
|---|---|---|
| DE | 101 04 221 | 4/2002 |
| EP | 0122687 A | 10/1984 |

(Continued)

OTHER PUBLICATIONS

English translation of 2003232918, 11 pages.*

(Continued)

*Primary Examiner* — David E Graybill
(74) *Attorney, Agent, or Firm* — Eric J. Robinson; Robinson Intellectual Property Law Office, P.C.

(57) ABSTRACT

The present invention provides a new type wireless chip that can be used without being fixed on a product. Specifically, a wireless chip can have a new function by a sealing step. One feature of a wireless chip according to the present invention is to have a structure in which an integrated circuit is sealed by films. In particular, the films sealing the integrated circuit have a hollow structure; therefore the wireless chip can have a new function.

14 Claims, 30 Drawing Sheets

(56) References Cited

U.S. PATENT DOCUMENTS

| | | |
|---|---|---|
| 6,246,327 B1 | 6/2001 | Eberhardt |
| 6,742,655 B2 | 6/2004 | Kasakura |
| 7,220,987 B2 | 5/2007 | Kuroda et al. |
| 7,304,324 B2 | 12/2007 | Kuroda et al. |
| 7,518,692 B2 | 4/2009 | Yamazaki et al. |
| 2002/0133942 A1 | 9/2002 | Kenison et al. |
| 2002/0153526 A1* | 10/2002 | Toyama et al. ............ 257/48 |
| 2002/0174627 A1* | 11/2002 | Kitamura et al. ........... 53/400 |
| 2002/0179460 A1* | 12/2002 | Kitamura et al. ......... 206/204 |
| 2003/0057113 A1* | 3/2003 | Kitamura et al. ......... 206/204 |
| 2003/0183346 A1 | 10/2003 | Aarts et al. |
| 2005/0026340 A1* | 2/2005 | Iriguchi ..................... 438/164 |
| 2005/0046022 A1* | 3/2005 | Alter ........................... 257/734 |
| 2005/0189679 A1 | 9/2005 | Kenison et al. |
| 2007/0085078 A1 | 4/2007 | Kuroda et al. |
| 2010/0133349 A1* | 6/2010 | Shingai ...................... 235/492 |

FOREIGN PATENT DOCUMENTS

| | | | |
|---|---|---|---|
| EP | 0360194 A | | 3/1990 |
| EP | 0694874 A | | 1/1996 |
| EP | 1243946 A | | 9/2002 |
| EP | 1437683 A | | 7/2004 |
| EP | 1533845 A | | 5/2005 |
| JP | 57-022041 | | 2/1982 |
| JP | 59-172253 A | | 9/1984 |
| JP | 60-160145 | | 8/1985 |
| JP | 61-027663 A | | 2/1986 |
| JP | 61-144062 | | 9/1986 |
| JP | 02-169229 A | | 6/1990 |
| JP | 08-175058 A | | 7/1996 |
| JP | 10-293827 A | | 11/1998 |
| JP | 2002-517870 | | 6/2002 |
| JP | 2002-200674 A | | 7/2002 |
| JP | 2003-016405 | | 1/2003 |
| JP | 2003-017514 A | | 1/2003 |
| JP | 2003-223626 A | | 8/2003 |
| JP | 2003-243918 | | 8/2003 |
| JP | 2003-340940 A | | 12/2003 |
| JP | 2004-006540 A | | 1/2004 |
| JP | 2004-037902 | | 2/2004 |
| JP | 2004-220591 A | | 8/2004 |
| JP | 2006-163719 A | | 6/2006 |
| WO | WO-99/65002 | | 12/1999 |
| WO | WO-99/67754 | | 12/1999 |
| WO | WO-00/16278 | | 3/2000 |
| WO | WO-00/16279 | | 3/2000 |
| WO | WO 2004/015778 | | 2/2004 |

OTHER PUBLICATIONS

English translation of JP 2003-243918, 11 pages.*
European Search Report (Application No. 05019377.0) dated Apr. 12, 2007.
International Search Report (Application No. 05019377.0) dated Nov. 15, 2006.
European Search Report (Application No. 10010231.8) Dated Mar. 28, 2012.

* cited by examiner 400 403 404 401

400 403

WIRELESS CHIP AND MANUFACTURING METHOD OF THE SAME

BACKGROUND OF THE INVENTION

1. Field of the Invention

The present invention relates to a wireless chip and a manufacturing method of the wireless chip.

2. Description of the Related Art

In recent years, a wireless chip for transmitting and receiving data has been actively developed and such a wireless chip is called, e.g., an IC tag, an ID tag, an RF (Radio Frequency) tag, a wireless tag, an electronic tag, a wireless processor, a wireless memory. For a transmission system of a wireless chip, there are three systems of an electromagnetic coupling system, an electromagnetic induction system and a radio wave system. The electromagnetic coupling system employs a mutual induction of electric coils by alternating magnetic field, and employs a frequency of 13.56 MHz. The electromagnetic induction system employs two frequencies with classifying broadly. One is 135 kHz or less and the other is 13.56 MHz. Communication having a range of maximum 1 m with a wireless chip can be conducted by the electromagnetic induction system depending on a shape and a size of a reader/writer. The radio wave method employs UHF and a frequency band of 2.45 GHz. The radio wave system has the greatest feature that a communication range is long. Such a wireless chip is used with the chip fixed to a product, e.g., attached on a surface of the product, or embedded in the product. For example, the chip is embedded in an organic resin constituting a package, or attached on the surface of the package.

SUMMARY OF THE INVENTION

However, it is complicated to fix the wireless chips that have been used recently to a product, e.g., to embed it in the product or attach it on the product. It is an object of the present invention to provide a new type wireless chip that can be used without being attached to a product. Specifically, it is another object to add a new function to a wireless chip by sealing. Further, it is another object of the present invention to manufacture a wireless chip by an easy method.

One feature of a wireless chip according to the present invention is to have a structure in which a thin film integrated circuit is sealed with a film. The wireless chip of the present invention can be obtained by sandwiching a thin film integrated circuit with two films and heating the parts of the films around the thin film integrated circuit to be melted so as to seal the thin film integrated circuit. In case that a plurality of thin film integrated circuits are sandwiched between two films, wireless chips according to the present invention can be obtained by heating and melting parts of the films between neighboring thin film integrated circuits so as to seal the plurality of the thin film integrated circuits.

One feature of a wireless chip according to the present invention is that the films sealing the thin film integrated circuit makes a hollow structure. In other words, a space is provided between the films and the thin film integrated circuit when the thin film integrated circuit is sealed.

By employing the hollow structure, an additional function can be added, which is not obtained in the case of not using the hollow structure.

A wireless chip with the hollow structure according to the present invention has a feature that an inert gas, an inert liquid, or an inert gel is encapsulated in the hollow portion. "To encapsulate an inert gas, an inert liquid, or an inert gel in a hollow portion" includes a case of filling a hollow portion with an inert gas, an inert liquid, an inert gel or the like.

One feature of a wireless chip according to the present invention is that a gas promoting degradation of a thin film integrated circuit (e.g., a gas including water) is encapsulated in a hollow portion in a wireless chip having the hollow structure.

In addition, in a wireless chip of the present invention, when the films sealing the thin film integrated circuit are broken, air or liquid outside the films enters the inside of the films sealing the thin film integrated circuit and is in contact with the thin film integrated circuit. In this case, degradation speed of the thin film integrated circuit is increased (the degradation speed is made greatly different in the case where the thin film integrated circuit is not exposed to the air outside the films sealing the thin film integrated circuit and the case where the thin film integrated circuit is exposed to the air outside the films sealing the thin film integrated circuit), which is one feature of the wireless chip according to the present invention. For example, one feature of the present invention is that a thin film integrated circuit is easy to deteriorate when it is exposed to the air.

In order that a thin film integrated circuit deteriorates easily when it is exposed to the air, for example, there is provided a method of shifting electric characteristics of a thin film transistor included in the thin film integrated circuit near an operation limit. In this manner, the thin film transistor stops operating due to an external factor. Here, the external factor means to break the films sealing the thin film integrated circuit. In order to shift the electric characteristics, a method of doping a channel forming region of a thin film transistor with an impurity element such as boron or phosphorus, or the like may be employed to obtain desired electric characteristics.

The method of shifting electric characteristics of a thin film transistor included in the thin film integrated circuit near an operation limit is described below with reference to FIG. 31. In FIG. 31, the horizontal axis indicates a gate voltage (Vg) and the vertical axis indicates a drain current (Id). A drain current required for operation of a thin film transistor is Ion and a gate voltage to be applied for driving the thin film transistor is Von. At the time of Vg=Von, an electric characteristic 3101 shows Id>Ion and the thin film transistor operates. However, when it is shifted to an electric characteristic 3102, Id is equal to Ion (Id=Ion). Although the thin film transistor operates at this time, the thin film transistor does not operate if the electric characteristic is more shifted. By adopting an electric characteristic such as the electric characteristic 3102, the air enters the inside of the films sealing the thin film integrated circuits by breaking the films sealing the thin film integrated circuit, and it is possible that the thin film transistor is made not to operate since the electric characteristic of the thin film transistor is shifted by an influence of moisture or the like contained in the air.

In addition, degradation speed of the thin film integrated circuit can be made faster by exposing the thin film integrated circuit sealed by the films to an external atmosphere of the films, as compared with a case where the thin film integrated circuit is sealed with the films. For example, a substance promoting degradation of a thin film transistor included in a thin film integrated circuit may be included in the external atmosphere outside the films sealing the thin film integrated circuit. As the substance promoting degradation of a thin film transistor, for example, Na, K, ammonia, monoethanolamine, $H_2O$, $SO_x$, $NO_x$ or the like are given.

When a thin film transistor is exposed to an atmosphere containing the substance promoting degradation at a certain concentration, an electric characteristic of the thin film transistor is shifted as shown in FIG. 28. In FIG. 28, the horizontal axis indicates a gate voltage (Vg) and the vertical axis indicates a drain current (Id). Further, reference numeral 2800 denotes an electric characteristic of the thin film transistor before the thin film transistor is exposed to the atmosphere containing a substance promoting degradation, and 2801 denotes an electric characteristic after the thin film transistor is exposed to the atmosphere containing a substance promoting degradation. The shift amount before and after being exposed to the atmosphere containing a substance promoting degradation corresponds to A in FIG. 28. The shift amount of the electric characteristic varies depending on the concentration of the substance promoting degradation.

In general, if thin film transistors are formed to have the same electric characteristics, there could be slight variation in electric characteristics of the respective thin film transistors as shown by 2900, 2901 and 2902 in FIG. 29. Here, the range of variations in the electric characteristics of the respective thin film transistors are expressed by ±x with the electric characteristic 2901 as a reference. In FIG. 29, the horizontal axis indicates a gate voltage (Vg) and the vertical axis indicates a drain current (Id). A drain current required for operating a thin film transistor is Ion, and a gate voltage applied to drive the thin film transistor is Von. In general, the drain current is set so that higher current value than Ion can be obtained by applying Von also in the electric characteristic 2903 which is assumed to be more shifted than the variation in electric characteristics of the respective thin film transistors to the direction of higher voltage. In addition, the drain current is set so that lower current value than Ion can be obtained by applying Vg=0 also in the electric characteristic 2904 which is assumed to be more shifted than the variation in electric characteristics of the respective thin film transistors to the direction of lower voltage. In other words, the electric characteristic 2903 and 2904 are operation limit electric characteristics. The shift amount of the electric characteristics 2903 and 2904 with respect to the electric characteristic 2901 are expressed by Y and Z, respectively. In FIG. 29, in the case of Vg=0, Id<I on is obtained in the electric characteristics 2900, 2901, 2902 and 2903, and the thin film transistor does not operate, while, in the case of Vg=Von, Id>Ion is obtained in the electric characteristics 2900, 2901, 2902 and 2904. Therefore, when the variation on the electric characteristics is in the range of −Z or more and +Y or less, the thin film transistor can operate normally.

When the thin film transistor has the electric characteristic 2900, the electric characteristic 2900 may be shifted beyond the electric characteristic 2903 as the operation limit electric characteristic, so that the thin film transistor cannot operate at the time of Vg=Von, either. Herein, the shift amount of from the electric characteristic 2900 to the electric characteristic 2903 that is an operation limit electric characteristic is X+Y. Therefore, the electric characteristic may be shifted so that the shift amount thereof can be larger than X+Y in order to obtain a state in which the thin film transistor having the electric characteristic 2900 does not operate.

Then, the concentration of a substance promoting degradation included in the atmosphere outside films sealing the thin film integrated circuit is set so that the shift amount A in which an electric characteristic of a thin film transistor is shifted by being exposed to the atmosphere containing the substance promoting degradation of the thin film transistor is larger than X+Y, in which X is a range of variations on electric characteristics among the thin film transistors and Y is a shift amount of the operation limit electric characteristic. Then, by breaking the films sealing the thin film integrated circuit, an atmosphere outside the films sealing the thin film integrated circuit enters the inside of the films sealing the thin film integrated circuit. Thus, the thin film integrated circuit is exposed to the atmosphere containing the substance promoting degradation of the thin film transistor; therefore, the electric characteristic of the thin film transistor included in the thin film integrated circuit is shifted to the state as shown in FIG. 30 from the state shown in FIG. 29. In FIG. 30, the horizontal axis indicates a gate voltage (Vg) and the vertical axis indicates a drain current (Id). As shown in FIG. 30, Id<Ion is obtained in either cases of Vg=0 and Vg=Von, and the thin film transistor included in the thin film integrated circuit is not operated constantly, which results in defective operation.

One feature of a manufacturing method of wireless chips according to the present invention is that a plurality of thin film integrated circuits, which are arranged regularly, are sandwiched with first and second films, and the parts of the first and second films around each of the plurality of thin film integrated circuits are melted by a heating means, thereby sealing each of the plurality of thin film integrated circuits.

One feature of a manufacturing method of wireless chips according to the present invention is that a plurality of thin film integrated circuits, which are arranged regularly, are sandwiched with first and second films, and the parts of the first and second films around each of the thin film integrated circuits are melted by a heating means, thereby simultaneously sealing and sectioning the plurality of thin film integrated circuits.

One feature of a manufacturing method of a wireless chip according to the present invention is that a plurality of thin film integrated circuits, which are arranged regularly, are sandwiched with first and second films, and the part of the first film around each of the plurality of thin film integrated circuits is irradiated with laser light from above the first film. The parts of the first and second films around each of the thin film integrated circuits are melted by the laser irradiation, thereby simultaneously sealing and sectioning the plurality of thin film integrated circuits.

Moreover, one feature of a manufacturing method of a wireless chip according to the present invention is that a plurality of thin film integrated circuits, which are arranged regularly, are sandwiched with first and second films, the part of the first film around each of the plurality of thin film integrated circuits is pressed from above the first film by a heated wire. The parts of the first and second films around each of the thin film integrated circuits are melted by being pressed with the heated wire, thereby simultaneously sealing and sectioning the plurality of thin film integrated circuits.

A wireless chip having a structure in which a thin film integrated circuit is sealed by films and a manufacturing method thereof are described above. However, a circuit sealed with films is not limited to a thin film integrated circuit, as long as it is an integrated circuit. For example, an integrated circuit formed on a semiconductor substrate or a thick film integrated circuit may be adopted. An integrated circuit in which an integrated circuit formed on a semiconductor substrate, a thick film integrated circuit and a thin film integrated circuit are mixed, may also be employed.

A wireless chip according to the present invention has a structure in which a thin film integrated circuit is sealed by films and thus, the wireless chip can be used with putting directly in a bag for package, like a desiccant put in a bag for package of food together with food. Therefore, there is no risk that a wireless chip is peeled off since it is not required to be fixed by attaching on a product. Thus, the step of fixing the wireless chip on a product can be omitted.

Degradation of a thin film integrated circuit can be prevented by sealing a desiccant together with the thin film integrated circuit when the thin film integrated circuit is sealed.

In addition to the above described advantageous effects, other advantageous effects 1 to 5 can be obtained by employing such a hollow structure.

1. External impacts to a thin film integrated circuit can be reduced, since films for sealing the thin film integrated circuit (sealing films) has the hollow structure.

2. Degradation of the thin film integrated circuit can be prevented by encapsulating inert gas such as nitrogen gas in the hollow portion.

3. The period when the wireless chip can be used can be limited to a short period only, by encapsulating a gas promoting degradation of the thin film integrated circuit (e.g., gas containing moisture) in the hollow portion. The wireless chip can be suitable for the use in a field in which security, privacy or the like is important, by limiting the period when the wireless chip can be used to a short period only. The correlation between a concentration of a gas to be sealed in (a composition of a gas to be encapsulated) and a use period for the thin film integrated circuit is measured in advance and the concentration of the gas to be encapsulated (a composition of a gas to be encapsulated) is varied; therefore, a use period of the wireless chip can be changed depending on an application thereof.

4. By employing the hollow structure, the wireless chip can float on water when it is thrown into water. Therefore, the wireless chip can be easily washed.

5. Heat from the outside is difficult to be conducted to the thin film integrated circuit because of the hollow structure. In particular, when a gas, a liquid or a gel to be encapsulated in the hollow portion has a low thermal conductivity, the heat from the outside is more difficult to be conducted.

Further, a structure can be employed, in which degradation speed of a thin film integrated circuit becomes faster in the case where gas or liquid outside the films sealing the thin film integrated circuit enters the inside of the films and the thin film integrated circuit is in contact with the gas or the liquid when the films sealing the thin film integrated circuit are broken. By the structure, the thin film integrated circuit deteriorates only by breaking the films sealing the thin film integrated circuit after the wireless chip is used, and thus the wireless chip cannot be used. Specifically, by employing such a structure that a thin film integrated circuit easily deteriorates by being exposed to an atmosphere (external air) (structure in which degradation speed is greatly different between the state in which it is exposed to the external air and the state in which it is not exposed to the external air), a state in which a thin film integrated circuit deteriorates and cannot be used can be obtained by exposing the thin film integrated circuit inside the films to the atmosphere (external air) by breaking the films sealing the thin film integrated circuit after the wireless chip is used. Therefore, since a state in which the wireless chip cannot be used can be obtained easily after it is used, the wireless chip can be suitable for the use in a field in which security, privacy or the like is important. By employing the hollow structure, the films sealing the wireless chip can be easily broken by breaking down the film having the hollow structure with a pressure, when the films sealing the thin film integrated circuit are broken after it is used.

In particular, in the case where a thin film integrated circuit is formed over a flexible substrate such as a resin substrate or the like, the thin film integrated circuit is difficult to be broken even when it is bent, since the substrate is flexible. Therefore, by employing the structure in which the thin film integrated circuit easily deteriorates when being exposed to the atmosphere (external air) (structure in which degradation speed is greatly different between the state in which it is exposed to the external air and the state in which it is not exposed to the external air), the method by which the wireless chip cannot be used by breaking the films sealing the thin film integrated circuit after the wireless chip is used is extremely effective.

The advantageous effects in the case of the thin film integrated circuit are described above; however, the same effects as described above can be obtained in circuits other than thin film integrated circuits.

DETAILED DESCRIPTION OF THE INVENTION

Figure 1A:
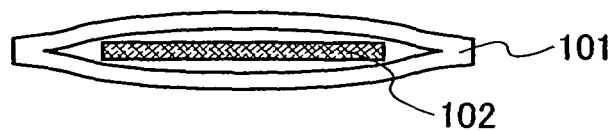
FIGS. 1A to 1C each show a cross-sectional structure of a sealed wireless chip according to an aspect of the present invention.

Embodiment mode according to the present invention will hereinafter be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment mode to be given below. Note that the same reference numerals are used for the same portions through drawings in the structures of the present invention to be explained hereinafter.

A structure of a wireless chip according to the present invention is described with reference to FIGS. 1A to 1C. FIG. 1A shows a first cross-sectional structure of a wireless chip according to the present invention. The wireless chip according to the present invention includes a thin film integrated circuit 102, and a film 101 sealing the thin film integrated circuit 102.

Figure 1B:
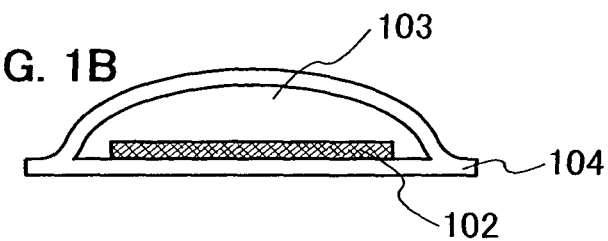

FIG. 1B shows a second cross-sectional structure of a wireless chip according to the present invention. The wireless chip according to the present invention includes the thin film integrated circuit 102, and a film 104 sealing the thin film integrated circuit 102 and having a hollow portion 103. In other words, the thin film integrated circuit 102 is sealed inside the film 104 having a hollow structure. One of the films 104 sealing the thin film integrated circuit 102, which faces one side of the thin film integrated circuit, is planar and the other of the films 104, which faces the other side, has convex portions.

In the structure shown in FIG. 1B, a film having plural convex portions (an embossed film) is used as one of the two films for sealing. Sealing can be conducted so that thin film integrated circuits are arranged in the convex portions and the parts of the films around each of the thin film integrated circuits are melted by heating. In this manner, the thin film integrated circuit is sealed so that the hollow portion 103 is formed inside the films.

Figure 1C:
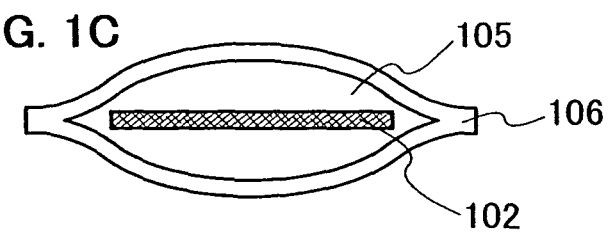

FIG. 1C shows a third cross-sectional structure of a wireless chip according to the present invention. The third structure is a modification of the second structure. The third structure includes the thin film integrated circuit 102, and a film 106 sealing the thin film integrated circuit 102 to have a hollow portion 105. The films 106 sealing the thin film integrated circuit 102, which face the opposite sides of the thin film integrated circuits, both have convex portions, and thus, the volume of the hollow portion is larger than that of the second structure.

In the structure shown in FIG. 1C, a film having plural convex portions (an embossed film) is used as the both of the two films for sealing. Sealing can be conducted so that thin film integrated circuits are arranged in the convex portions and parts of the films around each of the thin film integrated circuit is melted by heating. In this manner, the thin film integrated circuit is sealed so that the hollow portion 105 is formed inside the films.

If a thin film integrated circuit of the wireless chip shown in FIG. 1B or 1C is not fixed on the film, the thin film integrated circuit can move inside the films 104 or 106 sealing the thin film integrated circuit.

One feature of a wireless chip according to the present invention is that an inert gas such as a nitrogen gas, an inert liquid such as Fluorinert™ (this trademark is owned by 3M™), an inert gel or the like can be encapsulated in the hollow portion 103 or 105 in the wireless chip having a hollow structure. A known material can be used as the inert gas or the inert liquid, in addition to nitrogen gas or Fluorinert.

One aspect of a wireless chip according to the present invention is that a gas promoting degradation of a thin film integrated circuit (such as gas containing moisture) can be encapsulated in the hollow portion 103 or 105 in the wireless chip having a hollow structure. A state in which the hollow portion 103 or 105 is filled with a gas promoting degradation of a thin film integrated circuit can be obtained by sealing the thin film integrated circuit in an atmosphere containing the gas promoting degradation of the thin film integrated circuit.

Figure 2A:
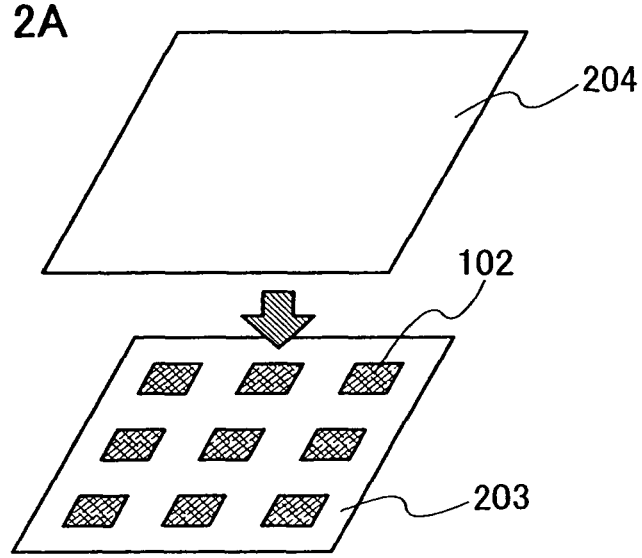
FIGS. 2A to 2C each show a manufacturing method of a sealed wireless chip according to an aspect of the present invention.
Figure 2B:
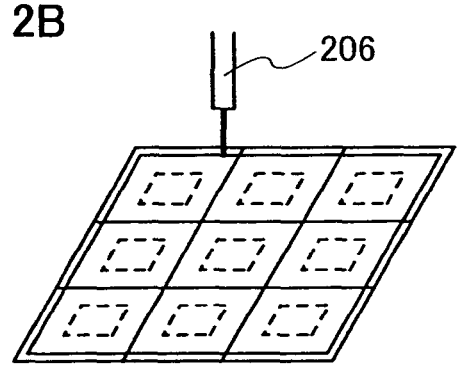
Figure 2C:
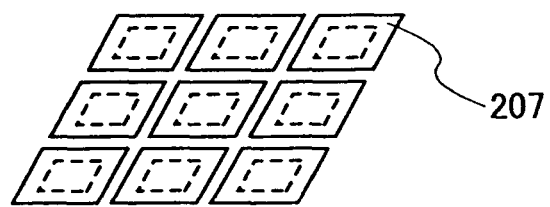

FIGS. 2A to 2C show a manufacturing method of the wireless chip shown in FIGS. 1A to 1C according to the present invention. A plurality of thin film integrated circuits 102 are arranged regularly over a first film 203. A second film 204 is arranged over the first film 203 in which the plurality of thin film integrated circuits 102 are arranged (FIG. 2A).

Figure 16:
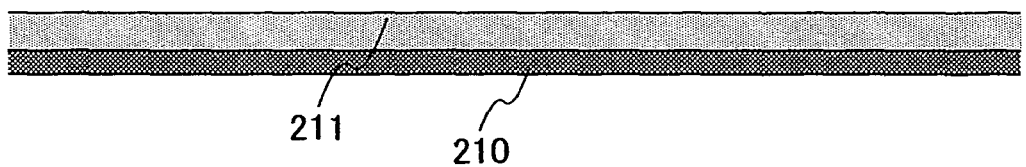
FIG. 16 is a drawing for explaining a cross-sectional structure of the first and second films.

A thermoplastic resin may be used for the first and second films. The thermoplastic resin used for the first and second films preferably has a low softening point. For example, polyolefin based resin such as polyethylene, polypropylene, or polymethylpentene; vinyl based copolymer such as vinyl chloride, vinyl acetate, polyvinyl chloride acetate copolymer, ethylene-vinyl acetate copolymer, vinylidene chloride, polyvinyl butyral, or polyvinyl alcohol; acrylic based resin; polyester based resin; urethane based resin; cellulosic based resin such as cellulose, cellulose acetate, cellulose acetate butyrate, cellulose acetate propionate, or ethyl cellulose; styrene based resin such as polystyrene or acrylonitrile-styrene copolymer can be nominated. A film having a single layer or plural layers of the thermoplastic resin may be used for the first and second films. The film with plural layers has, for example, a structure in which, over a base 210 including a first thermoplastic resin, an adhesive layer 211 including a second thermoplastic resin having a softening point lower than the first thermoplastic resin is formed as shown in FIG. 16. Note that FIG. 16 shows a two-layer structure; however, a structure having more than two layers may be employed. In addition, a biodegradable thermoplastic resin may be used.

Then, as shown in FIG. 2B, a laser oscillator 206 is used as a heating means to irradiate the part of the film 204 around the thin film integrated circuit 102 from above the second film 204 with laser light. At this time, the parts of the films around each of the thin film integrated circuits 102 are melted and sealed to be sectioned at the same time. In this case, the process can be simplified by conducting sealing and sectioning the thin film integrated circuits at the same time, and thus throughput can be enhanced. FIG. 2C shows a state after sealing and sectioning. In this manner, a wireless chip 207 is completed by sealing and sectioning. The cross-sectional view of the wireless chip 207 corresponds to FIG. 1A, 1B or 1C.

When the first and second films are both planar, the cross-sectional shape as shown in FIG. 1A is obtained. When one of the first and second films is a film having plural convex portions (an embossed film), thin film integrated circuits are arranged in the convex portions, and then sealing is conducted, the cross-sectional shape as shown in FIG. 1B is obtained. When the first and second films are each a film having plural convex portions (an embossed film), thin film integrated circuits are arranged in the convex portions, and then, sealing is conducted, the cross-sectional shape as shown in FIG. 1C is obtained.

In FIGS. 2A to 2C, the case where the parts of the films around each of the thin film integrated circuit 102 are melted by laser light to conduct sealing and sectioning is described; however, the parts of the first and second films around each of the thin film integrated circuits 102 may be melted by another heating means, instead of a laser, to conduct sealing and sectioning.

Figure 3:
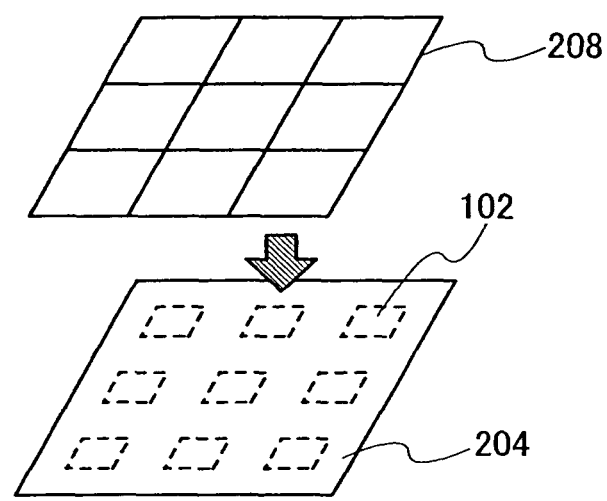
FIG. 3 shows a manufacturing method of a sealed wireless chip according to an aspect of the present invention.

For example, a heated wire 208 is pressed onto the second film 204 as shown in FIG. 3 to melt and seal the parts of first and second films around each of the thin film integrated circuit 102 to be sectioned.

The case where each thin film integrated circuit 102 is sealed and sectioned simultaneously has been described above; however the sealing and sectioning are not necessarily conducted simultaneously and may be conducted in different steps. In this case, since sealing can be conducted so that the first and second films are bonded to each other with a larger area than an area used for sectioning, sealing can be done more surely as compared with the case where sealing and sectioning are conducted simultaneously. In addition, if sealing and sectioning are conducted in different steps, either sealing or sectioning may be conducted first.

As an example of conducting sealing and sectioning in different steps, for example, the following method can be given: irradiation of laser light having energy density capable of only sealing but not even sectioning is performed so as to seal thin film integrated circuits, and then irradiation of laser light having energy density capable of sectioning is preformed so as to section the thin film integrated circuits. In this case, the width of laser light used for sealing is made larger than that of laser light for sectioning. By making the width of laser light for sealing larger than that of laser light for sectioning, the area for bonding the first and second films can be made large. Thus, sealing can be more surely conducted, as compared with the case sealing and sectioning are conducted simultaneously.

As another example of conducting sealing and sectioning in different steps, there is also given a method by which a heated wire 208, which has a larger width than that of the heated wire 208, is pressed onto the second film 204 to conduct only sealing and then, sectioning is conducted by the heated wire 208 or laser light. By making the width of the wire for sealing larger than that of the wire or laser light for sectioning, sealing can be conducted in such a way that the area for bonding the first and second films can be made larger than the sectioned area.

This embodiment mode has described the wireless chip having the structure in which the thin film integrated circuit is sealed by the films, and the manufacturing method thereof. However, the circuit sealed by the films is not limited to a thin film integrated circuit, as long as it is an integrated circuit. For example, an integrated circuit formed on a semiconductor substrate or a thick thin film integrated circuit may be employed. Moreover, an integrated circuit in which an integrated circuit formed on a semiconductor substrate, a thick film integrated circuit and a thin film integrated circuit are mixed may also be employed.

Embodiment 1

In Embodiment 1, an embodiment of a process up to arranging regularly a plurality of thin film integrated circuits 102 over the first film 203 is described.

Figure 4A:
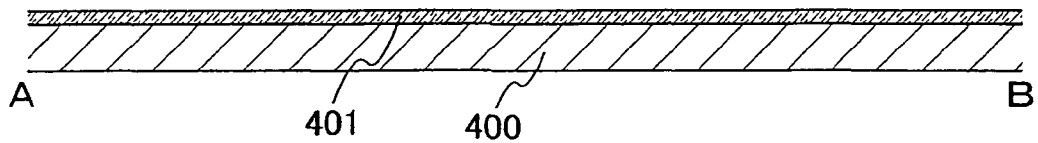
FIGS. 4A to 4E are each a drawing for explaining Embodiment 1.

First, a substrate 400 is prepared and a release layer 401 is formed over the substrate 400 as shown in FIG. 4A. Here, a release layer means a layer for facilitating releasing the plurality of thin film integrated circuits 102 from the substrate 400. Specifically, a glass substrate of, for example, barium borosilicate glass, aluminoborosilicate glass, a quartz substrate, a ceramic substrate, or the like can be used as the substrate 400. Further, a metal substrate such as stainless steel or a semiconductor substrate provided with an insulating film on its surface may also be used. Although a substrate made of a flexible plastic generally tends to have lower heat-resistance than the above-described substrate, it can be used as the substrate 400 as long as it can withstand process temperature in the manufacturing process. The surface of the substrate 400 may be planarized by polishing using a CMP method or the like.

The release layer 401 is formed with a metal film containing tungsten (W), molybdenum (Mo), niobium (Nb), titanium (Ti), silicon (Si) or the like. In this embodiment, a metal film containing W is used as the release layer 401. Note that a metal film including W can be formed by CVD, sputtering, electron beam, or the like; here, the metal film containing W is formed by the sputtering method. In the case where the thin film integrated circuit is physically peeled from the substrate in a subsequent step, a metal oxide (for example, $WO_x$) film may be formed over the metal film (for example, W). Other than W, $MoO_x$ formed over a Mo film, $NbO_x$ formed over a Nb film, $TiO_x$ formed over a Ti film, or the like can be used as the combination in which a metal oxide film is formed over a metal film. Further, only WOx, MoOx, NbOx, TiOx or the like may be formed as a release layer 401.

Note that, in FIG. 4A, the release layer 401 is formed directly on the substrate 400; however, a base film may be formed between the substrate 400 and the release layer 401. The base film can have a single-layer structure of an insulating film containing oxygen or nitrogen such as a silicon oxide ($SiO_x$) film, a silicon nitride ($SiN_x$) film, a silicon oxynitride ($SiO_xN_y$) film, or a silicon nitride oxide ($SiN_xO_y$) film or a stacked structure thereof. The base film is preferably formed between the substrate 400 and the release layer 401 particularly when there is a concern about contamination from the substrate.

Figure 4B:
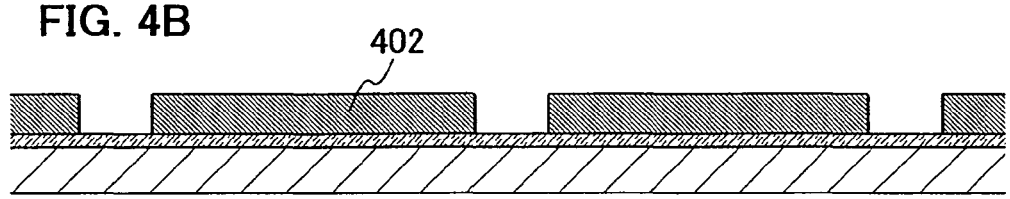

Next, a layer including an integrated circuit formed with a thin film transistor (TFT) 402 (hereinafter, referred to as a TFT layer 402) is formed over the release layer 401 (FIG. 4B). The TFT layer 402 may have any structure; for example, an LSI, a CPU, a memory, or the like can be provided.

Note that a semiconductor film included in the TFT layer 402 has a thickness of 0.2 µm or less, typically, 40 to 170 nm, preferably, 50 to 150 nm. Since such an extremely thin semiconductor film is used, the integrated circuit can be further thinned, compared with a chip formed using a silicon wafer.

Figure 4C:
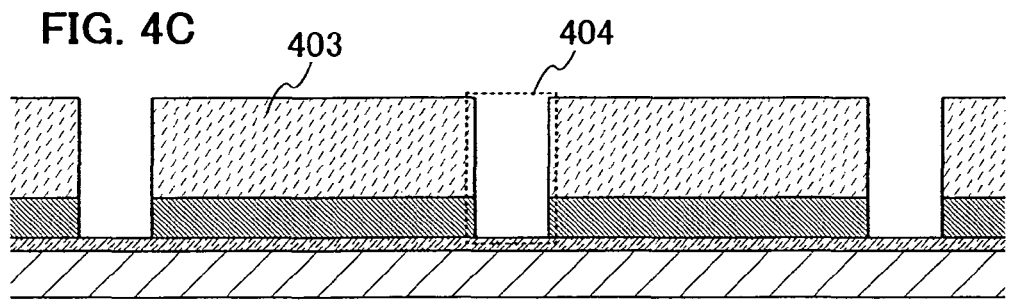
Figure 6A:
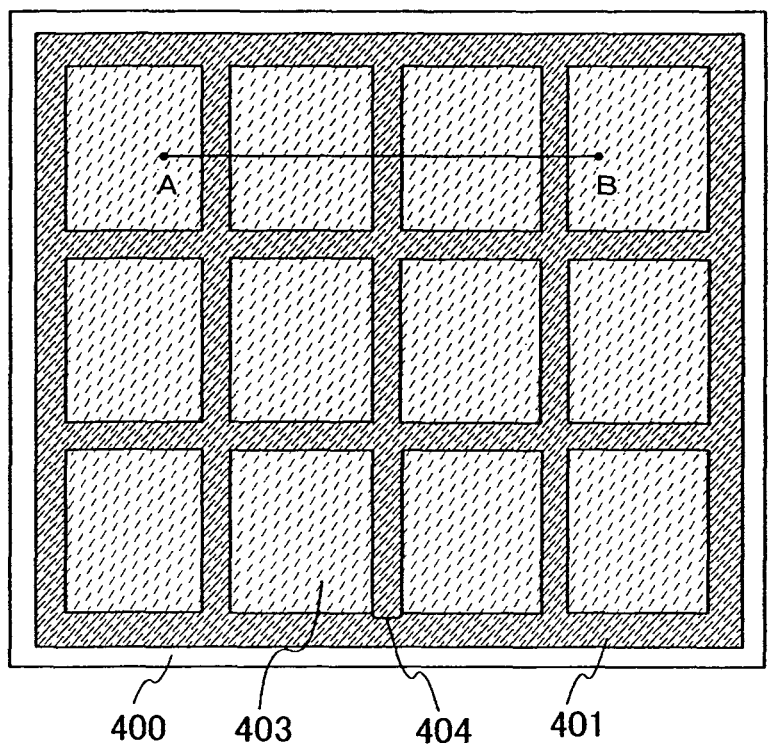
FIGS. 6A and 6B are each a drawing for explaining Embodiment 1.

Subsequently, a layer for securing strength 403 is formed over the TFT layer 402 (FIG. 4C). When the TFT layer 402 is peeled from the substrate 400, there is a risk that the TFT layer 402 may warp due to stress or the like and the thin film transistor or the like included in the TFT layer may be destroyed. The more thinly the TFT 402 is formed, the more noticeable the warpage in TFT layer 402 becomes. Therefore, by providing the TFT layer 402 with the layer for securing strength for reinforcement in advance before separating the TFT layer 402 from the substrate 400, the warpage of the peeled TFT layer 402 can be prevented. Note that a top view in this state is shown in FIG. 6A. FIG. 6A shows the case of forming twelve thin film integrated circuits over the substrate 400, and a cross-sectional view taken along line A-B in FIG. 6A corresponds to FIG. 4C.

For the layer for securing strength 403, a resin material such as an epoxy resin, an acrylic resin, a phenol resin, a novolac resin, a melamine resin, a urethane resin, or silicone resin can be used. Alternatively, the layer for securing strength 403 may be formed of an organic material such as benzocyclobutene, parylene, flare, polyimide or a photosensitive resin; a compound material formed by polymerization of siloxane polymer; a composition material containing a water-soluble homopolymer and a water-soluble copolymer; an inorganic film such as a SiN film, a $SiO_2$ film or a SiON film; or the like. In addition, the layer for securing strength 403 may be formed by stacking plural types of materials selected from the materials described above.

The layer for securing strength 403 can be formed by a screen printing method or a droplet discharge method. The droplet discharge method is a method for selectively discharging (spraying) a droplet of a composition including a material of a conductive film, an insulating film, or the like to form a film in an arbitrary position. The droplet discharge method includes as an inkjet method in some cases. An inorganic material may be used except the resin material when the inorganic material has a sufficient resistivity to an etching agent. As a method for forming the layer for securing strength 403, there is e.g., a method by which a photosensitive resin is applied by a spin coating method or the like, exposed to light and developed so that the photosensitive resin can remain in a necessary part, in addition to the screen printing method or the droplet discharge method described above.

Although FIGS. 4A to 4E show the case where the layer for securing strength 403 is formed over an upper surface of the TFT layer 402, the layer for securing strength 403 may be formed to cover a side face of the TFT layer 402 as well as the upper surface thereof. In this case, the TFT layer 402 can be effectively protected by the layer for securing strength 403 when the TFT layer 402 is peeled from the substrate 400. However, attention needs to be paid in this case so that the layer for securing strength 403 does not cover an opening 404 for introducing an etching agent later.

FIGS. 4A to 4E show the method for forming the layer for securing strength 403 after patterning the TFT layer 402; however, the present invention is not limited to this method. As shown in FIGS. 13A to 13D, there may be employed e.g., a method by which the layer for securing strength 403 is formed over the TFT layer 402, and patterned, and the TFT layer 402 is etched with the patterned layer for securing strength 403 as a mask.

Figure 4D:
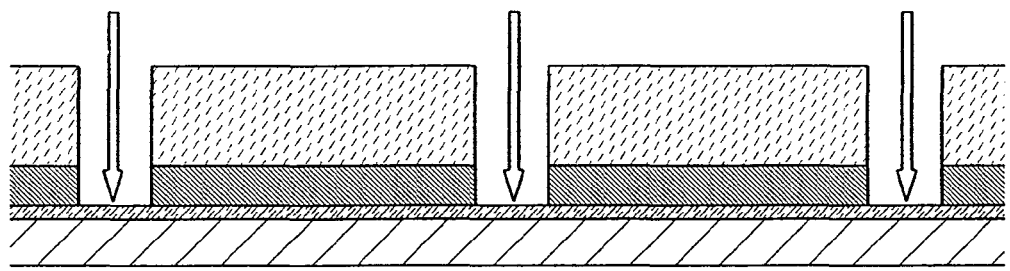

Then, the etching agent is introduced into the opening 404 to remove the release layer 401 as shown in FIG. 4D. In this embodiment, the release layer 401 is removed by chemical reaction thereof with the etching agent. As the etching agent, a gas or a liquid containing halogen fluoride (interhalogen compound), which easily reacts with the release layer 401, can be used. In this embodiment, a chlorine trifluoride ($CF_3$) gas, which reacts well with W used for the release layer 402, is used as the etching agent. Alternatively, a gas containing fluorine such as $CF_4$, $SF_6$, $NF_3$, $F_2$; a mixed gas of plural types thereof; or a strong alkali solution such as tetramethyl ammonium hydroxide (TMAH) may also be used, which may be appropriately selected by a practitioner.

Figure 4E:
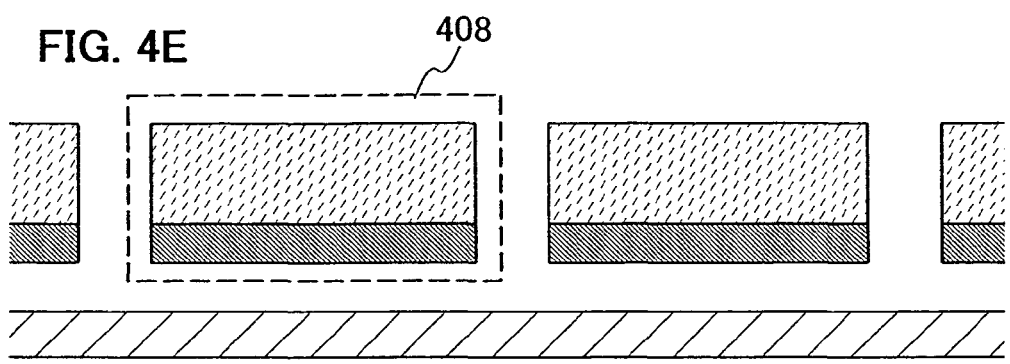
Figure 6B:
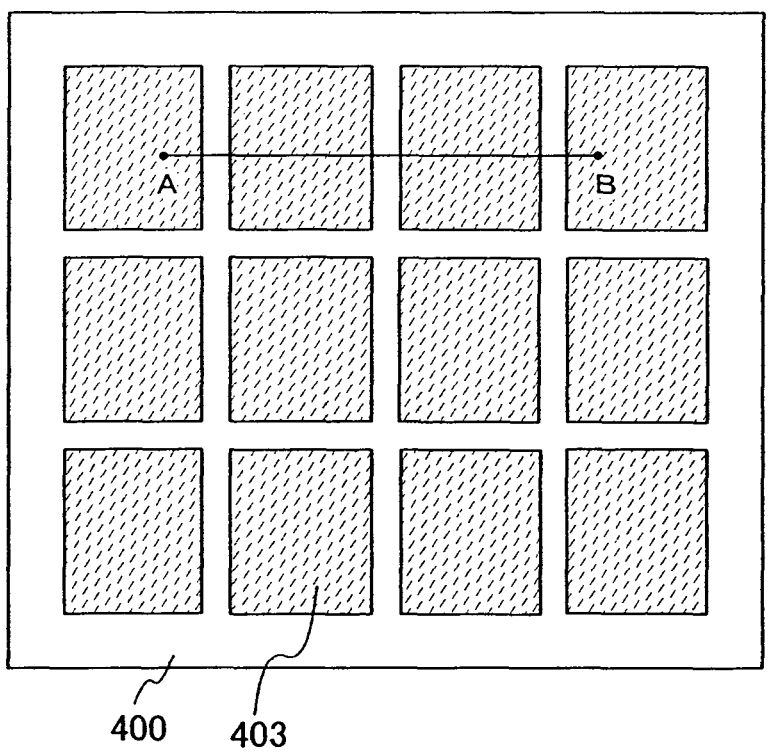

After removing the release layer 401, a thin film integrated circuit 408 including the TFT layer 402 and the layer for securing strength 403 is peeled from the substrate 400. In order to completely remove the release layer 401 in this embodiment, the thin film integrated circuit 408 can be peeled from the substrate 400 without using a physical means. The cross-sectional view of this state is shown in FIG. 4E and the top view thereof is shown in FIG. 6B.

Figure 7A:
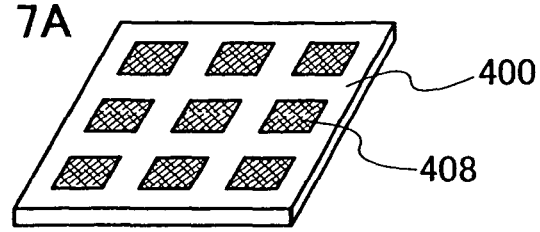
FIGS. 7A to 7C are each a drawing for explaining Embodiment 1.
Figure 7B:
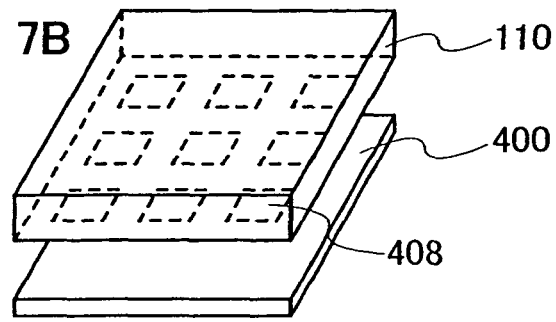
Figure 7C:
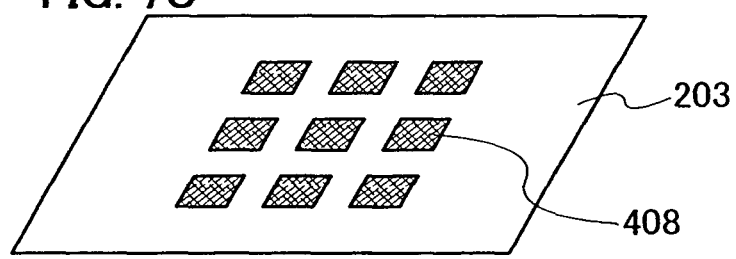

The perspective view after removing the release layer 401 is shown in FIG. 7A. Next, the thin film integrated circuits 408 on the substrate 400 are transferred onto the first film 203. Here, as shown in FIG. 7B, the thin film integrated circuits 408 peeled from the substrate 400 are transferred with them held by a vacuum chuck 110, and arranged over the first film 203 as shown in FIG. 7C.

Figure 5:
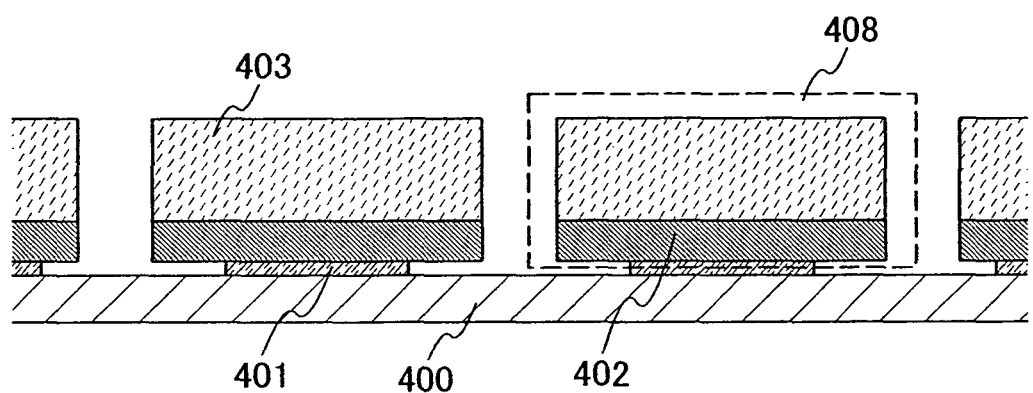
FIG. 5 is a drawing for explaining Embodiment 1.

Here, the case where the release layer 401 is removed completely is described; however, the release layer 401 may be removed such that a part of the release layer 401 remains as shown in FIG. 5. The thin film integrated circuit 408 is not peeled from the substrate 400 by the vacuum chuck 110 until the thin film integrated circuit 408 is sucked, as a result of making a part of the release layer 401 remain. Thus, the thin film integrated circuit 408 is not scattered.

The method for transferring the thin film integrated circuit 408 on the substrate 400 onto the first film 203 is not limited to the above described method using the vacuum chuck 110, and another method may be employed. Another method for transferring the thin film integrated circuit 408 on the substrate 400 onto the first film 203 is described with reference to FIGS. 8A to 8D.

Figure 8A:
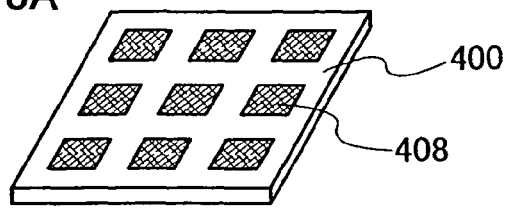
FIGS. 8A to 8D are each a drawing for explaining Embodiment 1.
Figure 8B:
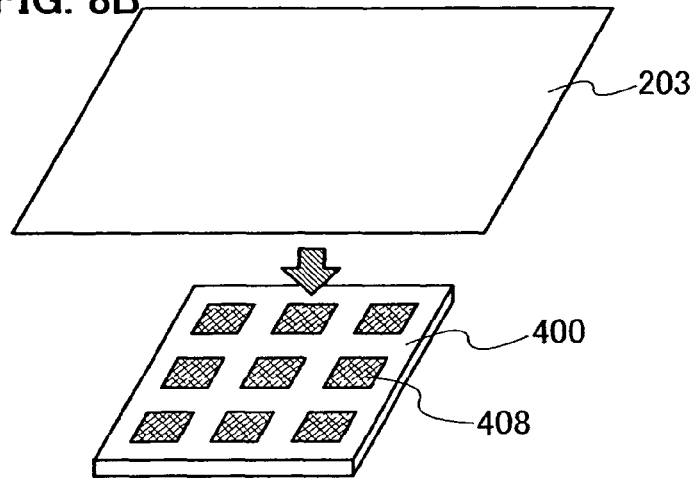
Figure 8C:
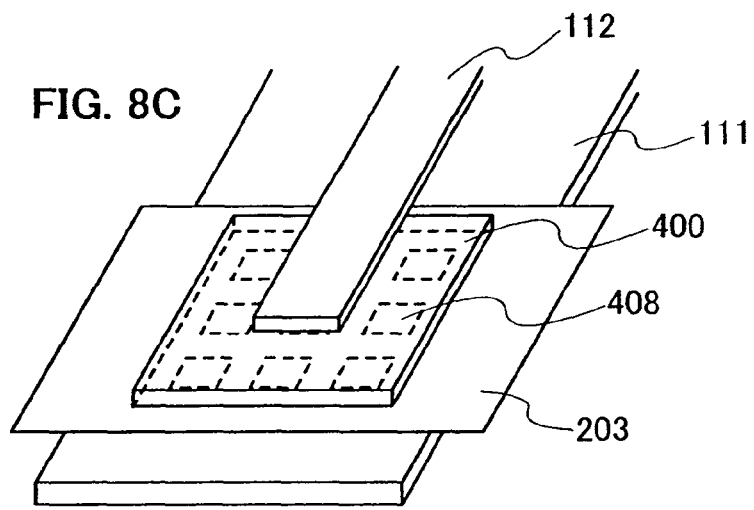
Figure 8D:
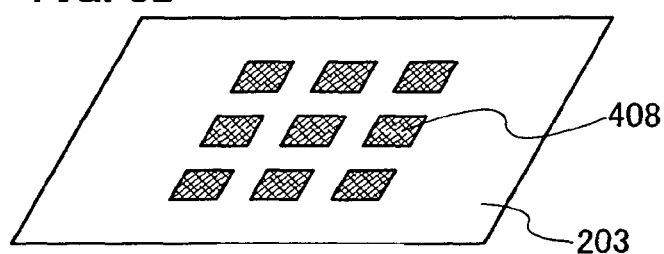

After completely removing the release layer 401, the first film 203 is arranged over the thin film integrated circuits 408 which are arranged over the substrate 400 and have been detached from the substrate 400 (FIG. 8B). The substrate 400, the thin film integrated circuit 408 and the first film 203 are sandwiched by arms 111 and 112 from the lower side of the substrate 400 and the upper side of the first film 203, and turned over by 180 degrees while keeping this state. Thus, a state shown in FIG. 8C is obtained. A state in which the thin film integrated circuits 408 are arranged regularly over the first film 203, as shown in FIG. 8D, can be obtained by removing the substrate 400.

Thereafter, sealing and sectioning of the thin film integrated circuits are conducted according to the method described in Embodiment Mode, thereby completing the wireless chip of the present invention.

The peeled substrate 400 can be reused. Accordingly, a thin film integrated circuit can be manufactured on such a substrate at low cost. Therefore, even in the case of using a quartz substrate, which is more expensive than a glass substrate, the thin film integrated circuit can be manufactured at low cost. Note that, in the case of reusing a substrate, the peeling step is preferably controlled so as not to damage the substrate. However, if the substrate is damaged, planarization process may be performed thereto by forming an organic or inorganic resin film on the substrate by a coating method or a droplet discharge method, or grinding or polishing the substrate.

In the case of thus manufacturing a wireless chip by forming a thin film integrated circuit over a substrate having an insulating surface, there is less limitation on the shape of the substrate, compared with the case of taking chips out of a circular silicon wafer. Therefore, the productivity of the wireless chips can be high, and mass production can be conducted. Moreover, cost can be reduced since the insulating substrate can be reused.

This embodiment has described the thin film integrated circuit formed on the substrate; however, the present invention is not limited thereto. An integrated circuit other than a thin film integrated circuit can be formed on a substrate. For example, a thick film integrated circuit may be formed on a substrate. In addition, a circuit in which a thick film integrated circuit and a thin film integrated circuit are mixed on a substrate may be employed.

This embodiment can be freely combined with the embodiment mode described above or the other embodiments.

Embodiment 2

Figure 14A:
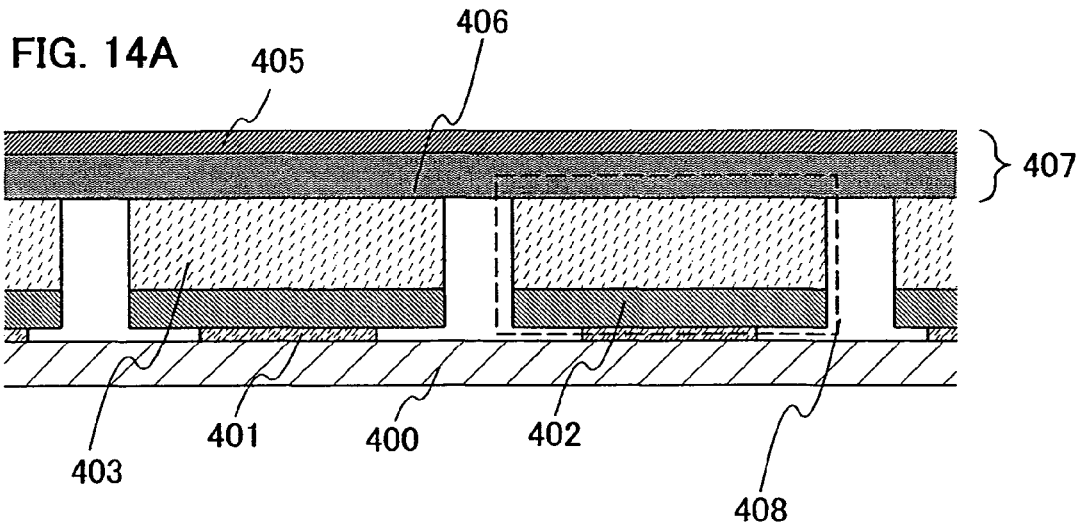
FIGS. 14A to 14C are each a drawing for explaining Embodiment 2.

In Embodiment 2, a method of using a film having an adhesive agent on one side thereof when the thin film integrated circuits 408 on the substrate 400 are transferred onto the first film 203 as shown in Embodiment 1, is described with reference to FIGS. 14A to 14C.

A state in FIG. 4E or 5 is obtained according to the method shown in Embodiment 1. Then, the thin film integrated circuits 408 are bonded to a film 407 as shown in FIG. 14A by positioning the film 407 having an adhesive layer 406 on one side of a base 405 over the thin film integrated circuit 408 so that the adhesive layer 406 can be in contact with the thin film integrated circuit 408, and pressing them from above the thin film integrated circuit 408. FIG. 14A shows an example of bonding the thin film integrated circuits 408 to the film 407 in the state of FIG. 5.

The film 407 may have, specifically, a structure in which the adhesive layer 406 is provided on the base 405 formed of polyester, or the like. The adhesive layer 406 is formed of a material such as a resin material containing acrylic resin or the like, or a synthetic rubber material.

Figure 14B:
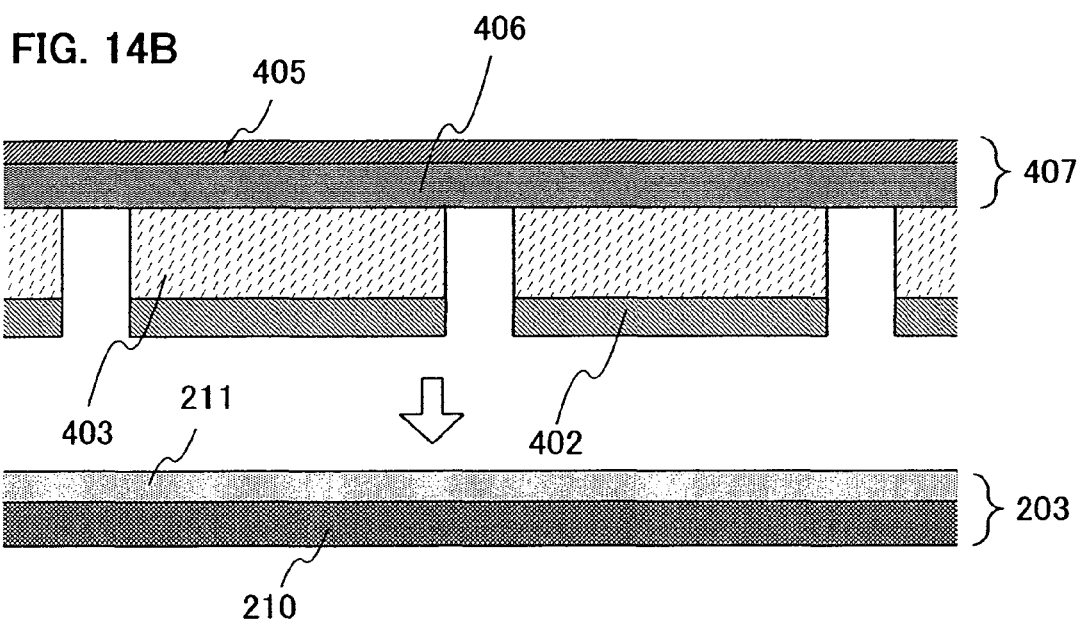
Figure 14C:
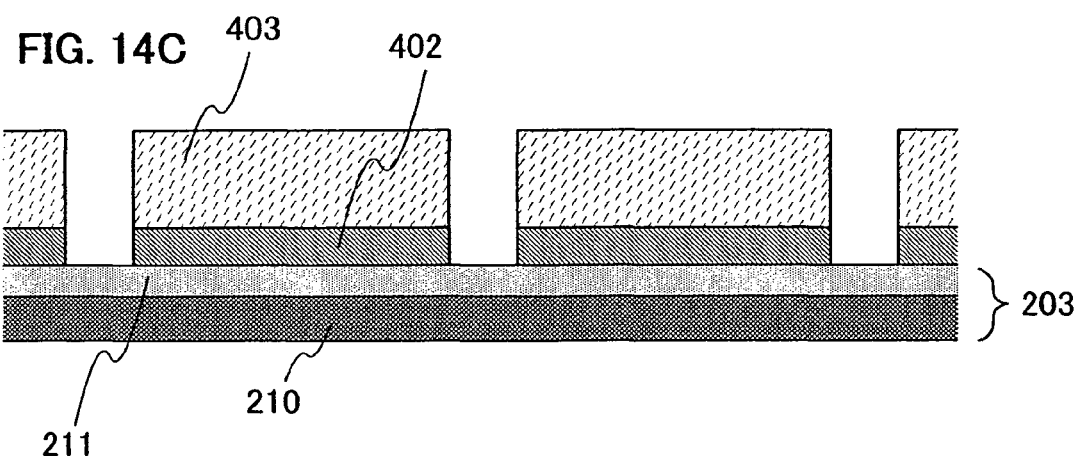

As shown in FIG. 14B, the first film 203 is positioned so as to be in contact with the thin film integrated circuit at a side opposite to the side in which the film 407 is bonded to the thin film integrated circuit 408. In this embodiment, a film having an adhesive layer 211 on a base 210 is used as the first film 203 as shown in FIG. 16. PET (polyethylene terephthalate) or the like may be used as the base. The adhesive layer 211 is formed of a resin having a softening point lower than the base 210, e.g., a resin mainly containing ethylene vinyl acetate copolymer (EVA), polyester, polyamide, thermoplastic elastomer, polyolefin, or the like. Because the softening point of the adhesive layer 211 is lower than that of the base 210, only the adhesive layer 211 is melted by heating, and is hardened by cooling. The first film 203 is positioned so that the adhesive layer 211 is in contact with the thin film integrated circuit 408. At least a portion of the first film 203 in which the thin film integrated circuit 408 exists is heated, and then, cooled such that the thin film integrated circuit 408 is bonded to the first film 203. And then, the thin film integrated circuit 408 is peeled from the film 407 (FIG. 14C).

Further, a film having weak adhesive force (preferably, 0.01 to 0.5 N, more preferably, 0.05 N to 0.35 N) is preferably used as the film 407 in order to bond the thin film integrated circuits 408 again to the first film 203 to be peeled from the film 407 after bonding the thin film integrated circuits 408 provided on the substrate 400 to the film 407. The thickness of the adhesive agent may be 1 to 100 μm, preferably, 1 to 30 μm. Preferably, the base 405 is formed to have a thickness of 10 μm to 1 mm for easy handling in processing.

By the method described above, the thin film integrated circuit 408 can be transferred onto the first film 203 from the substrate 400. Thereafter, sealing and the thin film integrated circuits and sectioning the films are conducted according to the method described in Embodiment Mode, thereby completing the wireless chip of the present invention.

This embodiment has described the case of transferring the thin film integrated circuits onto the first film 203; however, the present invention is not limited to a thin film integrated circuit as long as it is an integrated circuit. For example, an integrated circuit formed on a semiconductor substrate or a thick film integrated circuit may be used. In addition, an integrated circuit in which an integrated circuit formed on a semiconductor substrate, a thick film integrated circuit and a thin film integrated circuit are mixed, may be used.

This embodiment can be freely combined with the embodiment mode described above or the other embodiments.

Embodiment 3

Embodiment 3 describes a process up to a state in which a plurality of thin film integrated circuits are arranged over the first film 203 as shown in FIG. 2A, which is different from that in Embodiment 1.

Figure 9A:
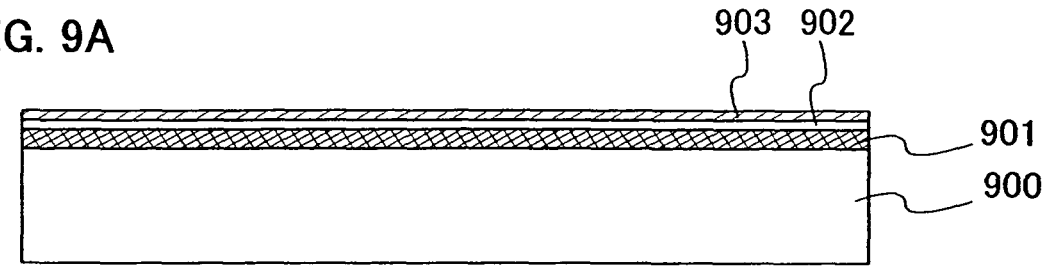
FIGS. 9A to 9D are each a drawing for explaining Embodiment 3.

A layer 901 including a plurality of thin film integrated circuits (hereinafter, a TFT layer 901) is formed over one surface of a substrate 900 having an insulating surface (FIG. 9A). The substrate 900 corresponds to a glass substrate such as barium borosilicate glass or alumino borosilicate glass, a quartz substrate, a ceramic substrate, a plastic substrate, an acrylic substrate, or the like. A metal substrate such as stainless steel or a semiconductor substrate having an insulating layer on its surface may also be used. The substrate 900 can be easily manufactured to have a length of 1 m or more on a side, and can have a desired shape such as a square or circular shape. Therefore, when the substrate 900 has a size of 1 m or more on a side, for example, the productivity can be drastically increased. This characteristic is a significant advantage compared with the case of wireless chips formed on a circular silicon substrate.

The TFT layer 901 includes at least a plurality of insulating films, a semiconductor layer and a conductive layer for constituting a plurality of elements, and a conductive layer serving as an antenna. Specifically, the TFT layer 901 includes a first insulating film serving as a base film, a plurality of elements provided over the first insulating film, a second insulating film covering the plurality of elements, a first conductive layer which is connected to the plurality of elements and is in contact with the second insulating film, a third insulating film covering the first conductive layer, a second conductive layer which serves as an antenna and is in contact with the third insulating film, and a fourth insulating film covering the second conductive layer. More specific structure is later described in Embodiment 4.

Figure 17:
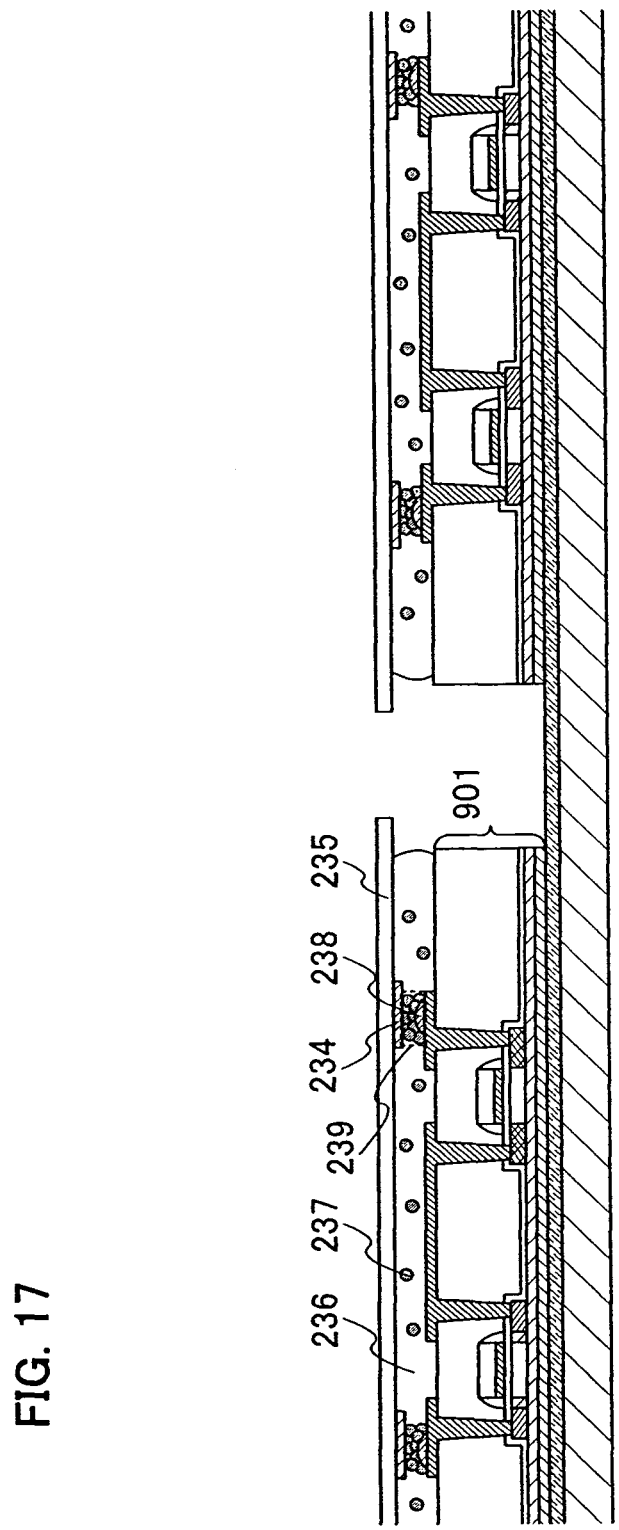
FIG. 17 is a drawing for explaining Embodiment 3.

The example of forming the conductive layer functioning as an antenna in the TFT layer 901 is shown here; however, an antenna substrate in which an antenna has been provided may be bonded to the TFT layer 901 by an adhesive agent or the like as shown in FIG. 17, without forming an antenna in the TFT layer 901.

In FIG. 17, an anisotropic conductive film 236 in which conductors 237 are scattered is used as a means for bonding the TFT layer 901 to an antenna substrate 235. The anisotropic conductive film 236 is pressure-bonded in a region 239 in which a connection terminal 238 of the wireless chip and a connection terminal 234 of the antenna are provided due to the thickness of terminals in each of the connection area, thereby realizing conduction between the connection terminal 238 of the wireless chip and the connection terminal 234 of the antenna. In the other region, conductors exist with a sufficient interval kept and thus, electrical connection is not made. Instead of using the anisotropic conductive film, the antenna substrate may be bonded to the TFT layer with an ultrasonic bond, an ultraviolet curing resin, a two-sided tape, or the like.

Next, a third film 902 is provided so as to cover the TFT layer 901 (or so as to cover the antenna substrate 235 in the case of bonding the antenna substrate 235 onto the TFT substrate as shown in FIG. 17). The third film 902 is a protective film for protecting the TFT layer 901. Then, a fourth film 903 is provided to cover the third film 902. The fourth film 903 includes a vinyl chloride resin, a silicone resin, or the like and is formed from a film having properties of expanding when being pulled (an expand film). Further, the fourth film 903 preferably has properties that the adhesion force is high in a normal state but becomes lower by light irradiation. Specifically, a UV tape whose adhesion force becomes lower by irradiation of ultraviolet light is preferably used.

The third film 902 may be provided as necessary. The third film 902 is provided so as to protect the TFT layer 901. When the TFT layer 901 is not required to be protected, the fourth film 903 may be provided on the second film, without providing the third film 902.

Figure 9B:
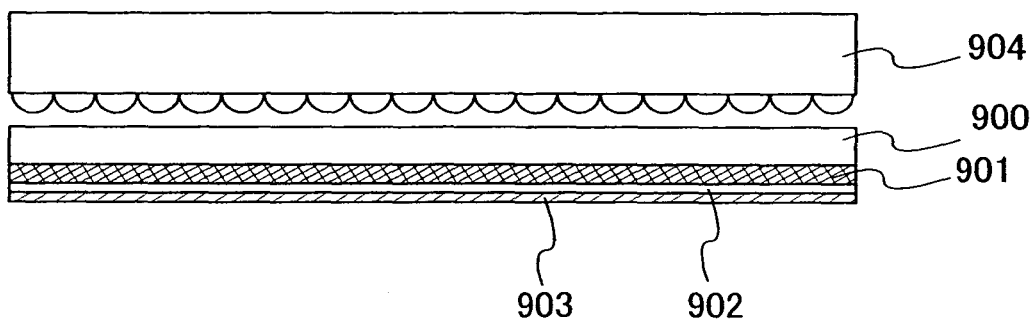

Next, the surface opposite to the one surface of the substrate 900 on which the TFT layer 901 has been formed is ground by a grinding means 904 (FIG. 9B). The substrate 900 is preferably ground until the thickness thereof becomes 100 μm or less. In general, in this grinding step, the surface of the substrate 900 is ground by rotating one or both of a stage with the substrate 900 fixed and the grinding means 904. The grinding means 904 corresponds to, for example, a grindstone.

Figure 9C:
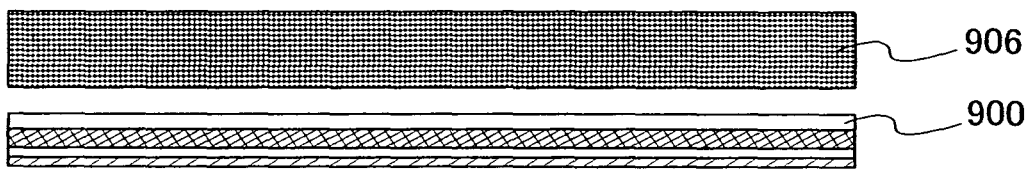

Next, the ground surface of the substrate 900 is polished by a polishing means 906 (refer to FIG. 9C). The substrate 900 is preferably polished until the thickness thereof becomes 20 μm or less. This polishing step is conducted, in the same way as the grinding step, by rotating one or both of the stage with the substrate 900 fixed and the polishing means 906. The polishing means 906 corresponds to, for example, a grindstone. After that, though not illustrated, the substrate is washed as necessary in order to remove dust generated in the grinding and polishing steps.

The example where the substrate is ground to have a thickness of 100 μm or less and then polished to have a thickness of 20 μm or less is described here; however, the thickness of the substrate after the grinding and polishing steps is not limited to these values. In addition, the example of conducting both of grinding and polishing steps for thinning the substrate is described here; however, the substrate can be thinned by only one of the grinding and polishing steps.

Figure 9D:
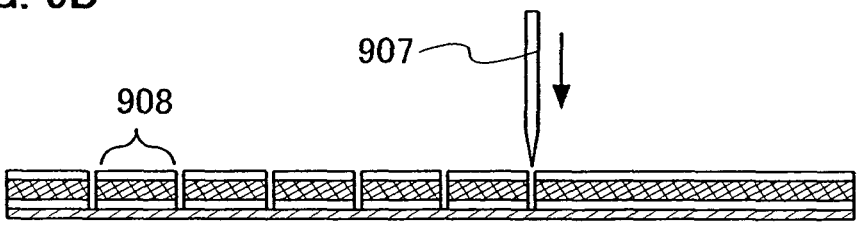

Then, the substrate 900, the TFT layer 901, and the third film 902 are cut by a cutting means 907. As to the TFT layer 901, the boundary of integrated circuits are cut so as to separate the plurality of thin film integrated circuits apart. Elements provided in the TFT layer 901 are not cut but the insulating film provided in the TFT layer 901 is cut. Through this cutting step, a plurality of thin film integrated circuits 908 are formed (FIG. 9D). The cutting means 907 corresponds to a dicer, a laser, a wire saw, or the like. In this step, the fourth film 903 is not cut.

Figure 10A:
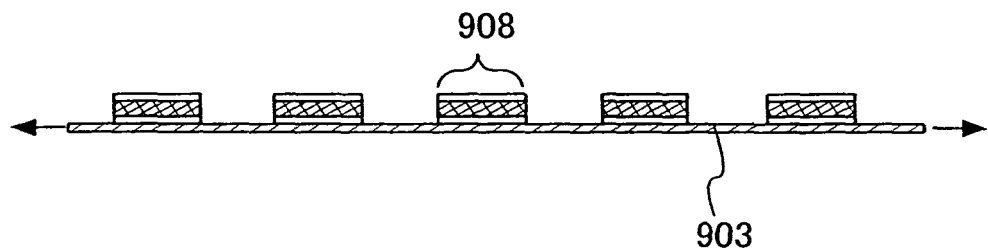
FIGS. 10A to 10D are each a drawing for explaining Embodiment 3.

Next, the fourth film 903 is expanded so as to form a space between the thin film integrated circuits 908 (FIG. 10A). At this time, the fourth film 903 is preferably expanded uniformly in a direction of the plane in order to make each space between the thin film integrated circuits 908 uniform. Subsequently, the fourth film 903 is irradiated with light. If the fourth film 903 is a UV tape, the fourth film 903 is irradiated with ultraviolet light. Then, the adhesion force of the fourth film 903 decreases, and the adhesiveness between the fourth film 903 and the thin film integrated circuits 908 is lowered. Thus, a state is obtained, in which the thin film integrated circuits 908 can be peeled from the fourth film 903 by a physical means.

Figure 10B:
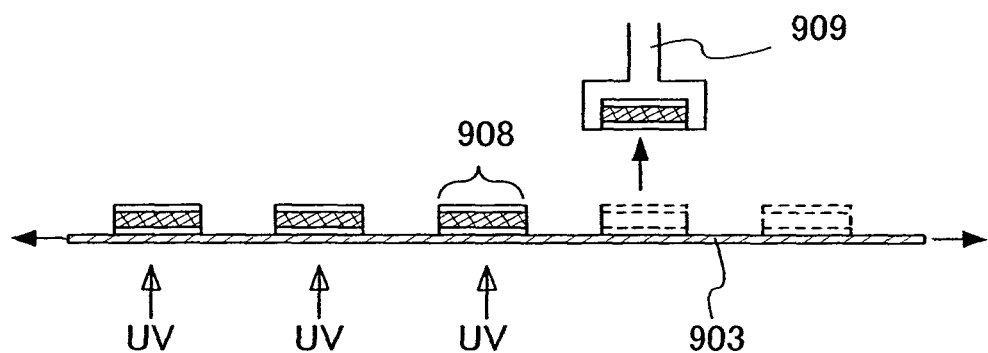

A pick-up means or a vacuum chuck may be employed as the physical means. When the pick-up means is adopted as the physical means, the fourth film 903 is irradiated with UV light and the thin film integrated circuit 908 is peeled from the fourth film 903 by the pick-up means 909 as shown in FIG. 10B. Then, the thin film integrated circuit 908 is set on the first film 203.

Figure 10C:
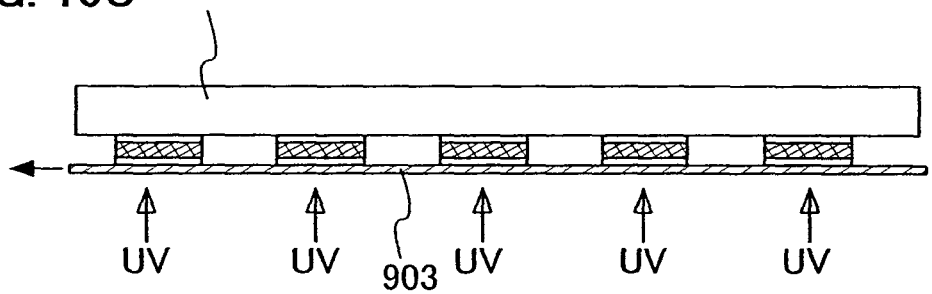
Figure 10D:
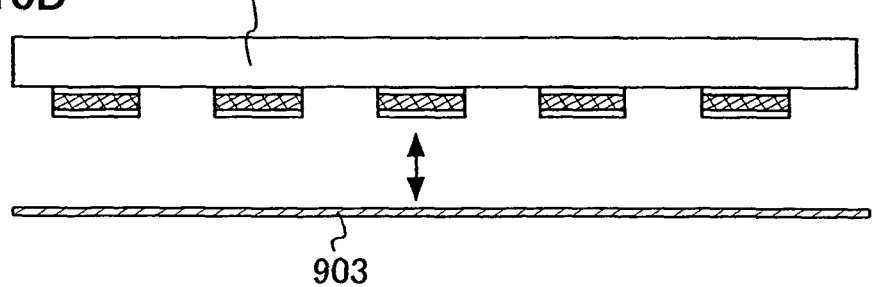

When the vacuum chuck is adopted as the physical means, the fourth film 903 is irradiated with UV light and the vacuum chuck 910 is positioned over the thin film integrated circuits 908 as shown in FIG. 10C. Then, the thin film integrated circuits 908 are transferred onto the first film 203 with the thin film integrated circuits 908 held by the vacuum chuck 910.

In the above process, the substrate 900 is cut (FIG. 9D) after the substrate 900 is ground (FIG. 9B) and polished (FIG. 9C). However, the order of the steps is not limited to this. The substrate 900 may be ground and polished after the substrate 900 is cut.

The thin film integrated circuits completed through the above described steps have a thin thickness and is light in weight.

This embodiment has described the case where the thin film integrated circuits are formed on the substrate; however the present invention is not limited thereto. An integrated circuit other than a thin film integrated circuit can be formed on a substrate. For example, a thick film integrated circuit may be formed over a substrate. In addition, a circuit in which a thick film integrated circuit and a thin film integrated circuit are mixed on a substrate may be formed. An integrated circuit may be formed on a semiconductor substrate, instead of forming a thin film integrated circuit on the substrate.

This embodiment can be freely combined with the embodiment mode described above or the other embodiments.

Embodiment 4

Embodiment 4 describes an example of using the expand film (fourth film) 903, described in Embodiment 3, as the first film 203 for sealing a thin film integrated circuit.

A state shown in FIG. 10A is obtained according to the method described in Embodiment 3. In this embodiment, since the expand film (fourth film) 903 is used as the first film 203, the thin film integrated circuit 908 is not required to be transferred onto the first film 203 from the fourth film 903. Therefore, the expand film used in this embodiment is not required to have a property that its adhesive force becomes weak when irradiated with light.

Figure 15:
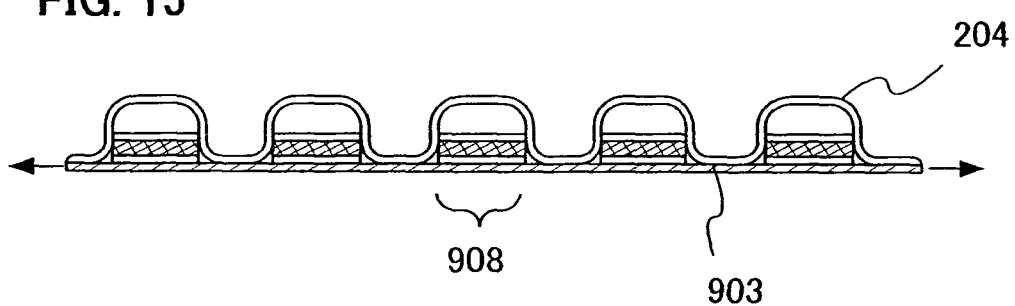
FIG. 15 is a drawing for explaining Embodiment 4.

Then, as shown in FIG. 15, the second film 204 is provided over the thin film integrated circuits 908, and the thin film integrated circuits 908 are interposed between the expand film 903 and the second film 204. FIG. 15 shows the second film having convex portions as one example. When a film having convex portions is used as the second film, the convex portions of the second film 204 are arranged directly above the thin film integrated circuits 908.

Thereafter, sealing and sectioning of the thin film integrated circuits are conducted according to the method described in Embodiment Mode, thereby completing the wireless chip of the present invention.

This embodiment has described the thin film integrated circuit; however, the present invention is not limited to a thin film integrated circuit as long as it is an integrated circuit. For example, an integrated circuit formed on a semiconductor substrate or a thick film integrated circuit may be used. In addition, an integrated circuit in which an integrated circuit formed on a semiconductor substrate, a thick film integrated circuit and a thin film integrated circuit are mixed, may be employed.

This embodiment can be freely combined with the embodiment mode described above or the other embodiments.

Embodiment 5

Embodiments 1 to 4 have shown the example of using an element formed by peeling the TFT layer and the layer for securing strength from the substrate by removing at least a part of the release layer, or the example in which an element obtained by thinning the substrate on which the TFT layer is provided, as the thin film integrated circuit; however, the present invention is not limited to the examples. A substrate provided with the TFT layer, which is not thinned, may be used as the thin film integrated circuit. In other words, the TFT layer may be formed on the substrate and may be sectioned into each unit circuit to be used as a thin film integrated circuit. In this case, for example, a thin film integrated circuit may be manufactured by omitting the process of thinning the substrate by grinding or polishing in Embodiment 3.

This embodiment has described the thin film integrated circuit; however, the present invention is not limited to a thin film integrated circuit as long as it is an integrated circuit. For example, an integrated circuit formed on a semiconductor substrate or a thick film integrated circuit may be used. In addition, an integrated circuit in which an integrated circuit formed on a semiconductor substrate, a thick film integrated circuit and a thin film integrated circuit are mixed, may be employed.

This embodiment can be freely combined with the embodiment mode described above or the other embodiments.

Embodiment 6

Figure 11:
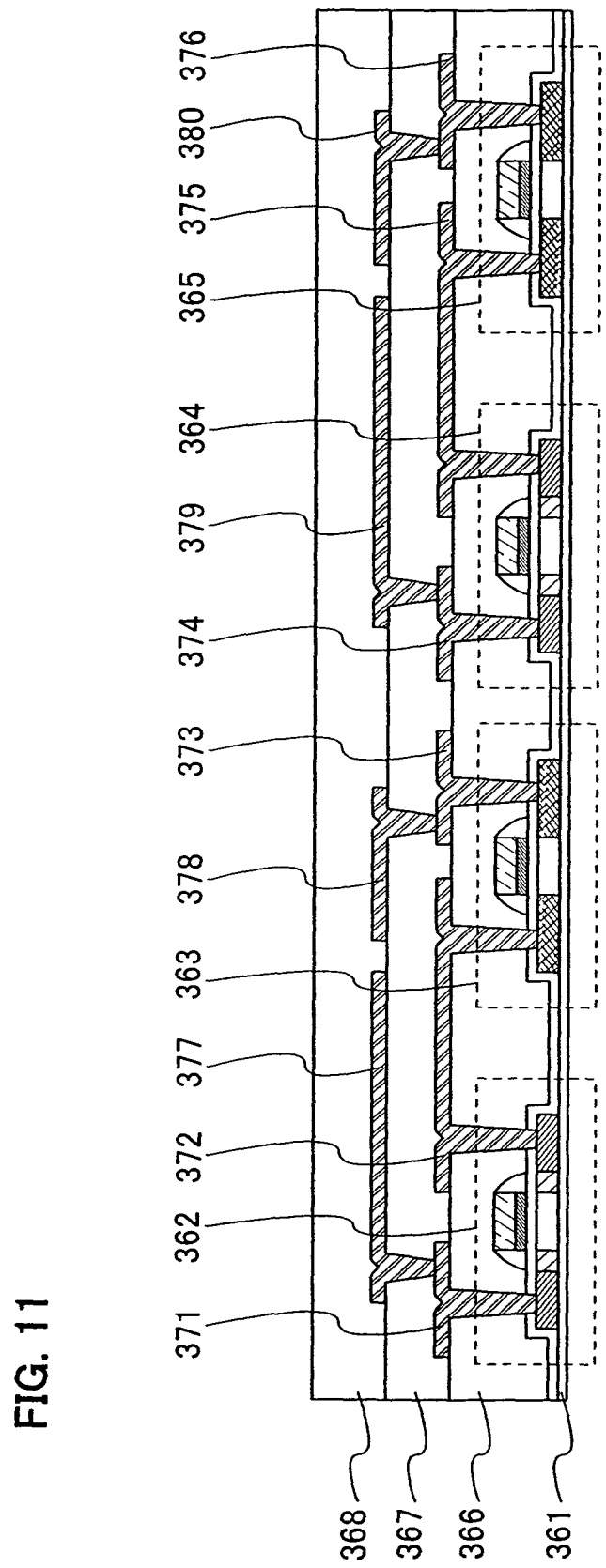
FIG. 11 is a drawing for explaining Embodiment 6.

Embodiment 6 describes a structure of the TFT layer with reference to FIG. 11 as one example.

Reference numeral 361 denotes an insulating film serving as a base film. The insulating film 361 includes a multilayer film including silicon nitride oxide and silicon oxynitride, a multilayer film including silicon oxynitride, silicon nitride oxide, and silicon oxynitride, or a multilayer film including silicon oxide, silicon nitride oxide, and silicon oxynitride or the like.

Next, a plurality of elements are formed over the insulating film 361. The plurality of elements correspond to, for example, a plurality of elements selected from a thin film transistor, a capacitor element, a resistor element, a diode, and the like. FIG. 11 shows a cross-sectional structure of N-channel type thin film transistors 362 and 364, and P-channel type thin film transistors 363 and 365. In FIG. 11, each of the thin film transistors 362 and 364 has an LDD (Lightly Doped Drain) structure including a channel-forming region, a lightly-doped impurity region, and a heavily-doped impurity region. Each of the thin film transistors 363 and 365 has a single-drain structure including a channel-forming region and an impurity region. Sidewalls are formed on side faces of gate electrodes of the thin film transistors 362 to 365. The structure of the thin film transistor is not limited to the above description, and any structure is applicable, for example the single-drain structure, an off-set structure, the LDD structure, a GOLD (Gate Overlapped Lightly Doped drain) structure or the like may be employed.

An insulating film 366 is formed so as to cover the thin film transistors 362 to 365. Source or drain wirings 371 to 376 to be electrically connected to impurity regions of the thin film transistors 362 to 365 are formed over the insulating film 366. An insulating film 367 is formed so as to cover the source or drain wirings 371 to 376. Conductive layers 377 to 380 electrically connected to the source or drain wirings 371 to 376 are formed over the insulating film 376. The conductive layers 377 to 380 serve as an antenna. An insulating film 368 is formed so as to cover the conductive layers 377 to 380.

This embodiment has described the example of forming the conductive layers serving as an antenna in the TFT layer; however, a structure may be employed, in which an antenna substrate provided with an antenna is bonded to the TFT layer to be electrically connected to each other, instead of forming the antenna in the TFT layer.

This embodiment can be freely combined with the embodiment mode described above or the other embodiments.

Embodiment 7

Figure 12:
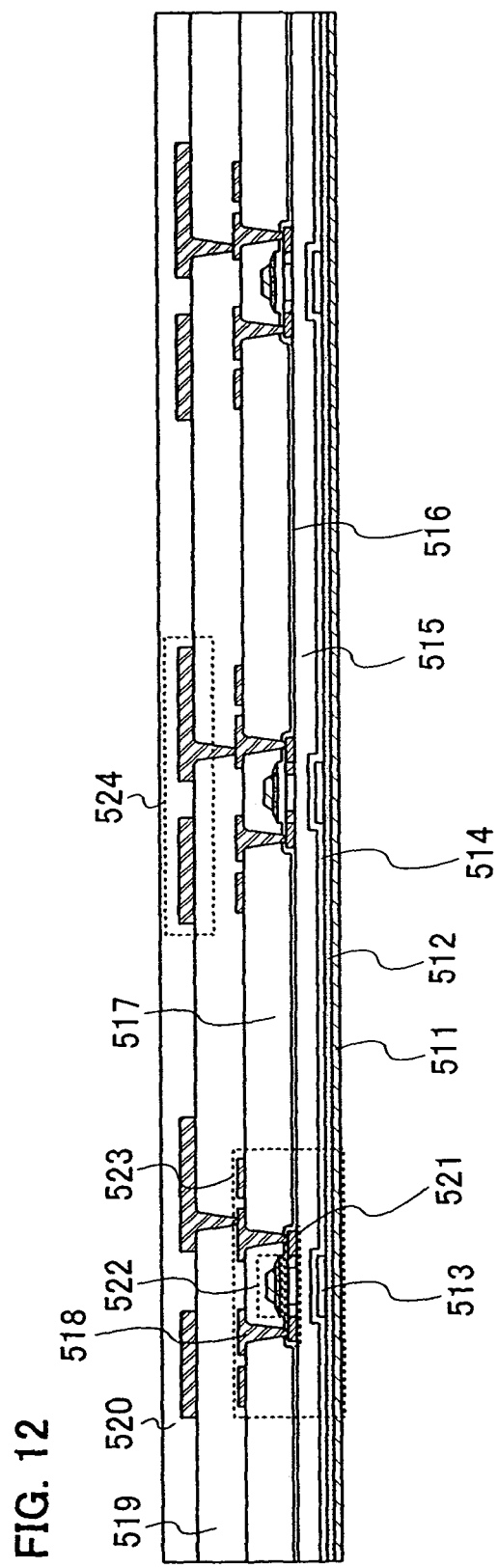
FIG. 12 is a drawing for explaining Embodiment 7.
Figure 13A:
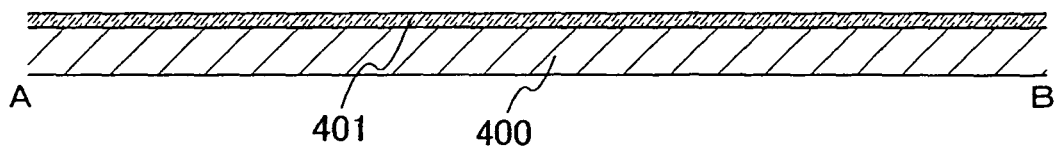
FIGS. 13A to 13D are each a drawing for explaining Embodiment 1.
Figure 13B:
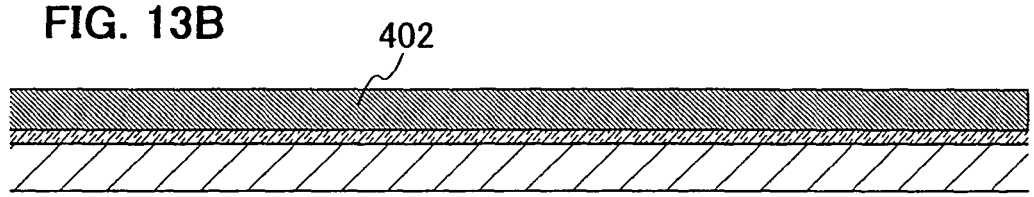
Figure 13C:
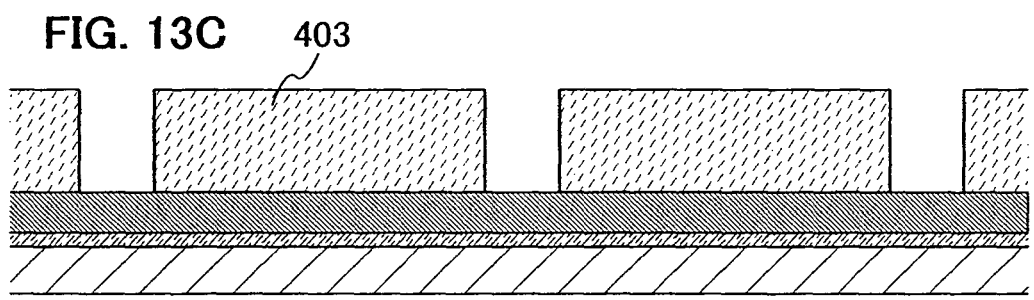
Figure 13D:
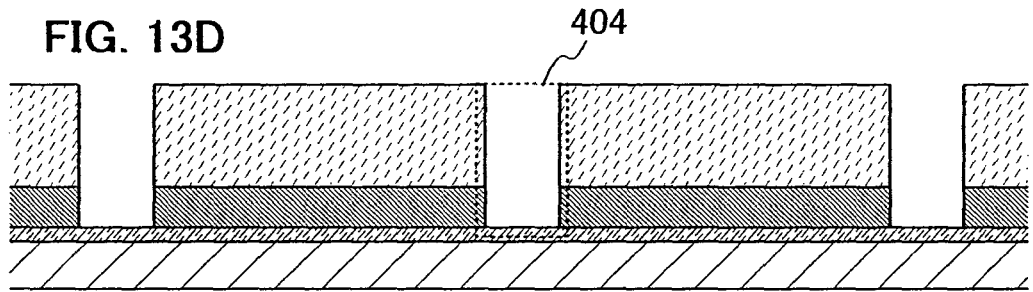

Embodiment 7 describes a structure of the TFT layer different from that in Embodiment 6 with reference to FIG. 12 as one example.

A silicon nitride film 511 and a silicon oxide film 512 are each an insulating film serving as a base film. A plurality of elements are formed over the silicon oxide film 512. Herein, the silicon nitride film 511 and the silicon oxide film 512 serving as the base insulating films are not limited to these materials and the order for stacking the films. As the base insulating film, for example, a multilayer film including silicon nitride oxide and silicon oxynitride, a multilayer film including silicon oxynitride, silicon nitride oxide, and silicon oxynitride, or a multilayer film including silicon oxide, silicon nitride oxide, and silicon oxynitride or the like may be employed. The plurality of elements correspond to, for example, a plurality of elements selected from a thin film transistor, a capacitor element, a resistor element, a diode, and the like. FIG. 12 shows a cross-sectional structure of a plurality of thin film transistors 523 each having a structure in which a channel forming region of a semiconductor layer 521 is interposed between a lower electrode 513 and a gate electrode 522 through an insulating film.

Hereinafter, a structure of the thin film transistor 523 is described. Insulating films 514 and 515 are formed over the lower electrode 513, and a semiconductor layer 521 is formed over the insulating film 515. Here, the lower electrode 513 can be formed from a polycrystalline semiconductor doped with a metal or an impurity having one conductivity type. W, Mo, Ti, Ta, Al or the like can be used as the metal.

The gate electrode 522 is formed over the semiconductor layer 521 with the gate insulating film 516 therebetween. In FIG. 12, the thin film transistor 523 is a thin film transistor having a GOLD structure; however, the present invention is not limited thereto. For example, an LDD structure having sidewalls on the side faces of the gate electrode may be adopted.

An insulating film 517 is formed to cover the semiconductor layer 521 and the gate electrode 522. A source or drain wiring 518 to be electrically connected to the source or drain region in the semiconductor layer 521 is formed over the insulating film 517.

An insulating film 519 is formed over the source or drain wiring 518, and a conductive layer 524 is formed over the insulating film 519. The conductive layer 524 serves as an antenna. An insulating film 520 is formed to cover the conductive layer 524.

The insulating films 515, 517, 519 and 520 may be an inorganic insulating film or an organic insulating film. A silicon oxide film or a silicon oxynitride film formed by a CVD method, a silicon oxide film applied by an SOG (Spin On Glass) method, or the like may be used as the inorganic insulating film. A film of polyimide, polyamide, BCB (benzocyclobutene), acrylic, a positive photosensitive organic resin, a negative photosensitive organic resin, or the like may be used as the organic insulating film. Moreover, a stacked structure of films formed of different materials, e.g., a multilayer including an acrylic film and a silicon oxynitride film may be used.

The TFT having the lower electrode described above has an advantageous structure in reducing the size thereof. In general, when the size of a TFT is reduced and the clock frequency for driving a circuit is increased, power consumption of an integrated circuit is increased. Therefore, by applying a bias voltage to the lower electrode and varying the bias voltage, the threshold voltage of the TFT can be changed, and thus the increase of power consumption can be suppressed.

The application of a negative bias voltage to the lower electrode of an N-channel TFT increases threshold voltage and reduces leakage. On the contrary, the application of a positive bias voltage decreases threshold voltage to make current easily flow to the channel, and the TFT can operate at higher speed or at a low voltage. On the other hand, the application of a bias voltage to the lower electrode of a P-channel TFT exhibits the opposite effect. Thus, the characteristics of an integrated circuit can be drastically improved by controlling the bias voltage applied to the lower electrode.

By balancing the threshold voltage of the N-channel TFT with that of the P-channel TFT using the bias voltage, the characteristics of an integrated circuit can be improved. In this case, both a power source voltage and the bias voltage applied to the lower electrode may be controlled in order to reduce power consumption. When the circuit is in a standby mode, a large reverse bias voltage is applied to the lower electrode. In an operation mode, a small reverse bias voltage is applied to the lower electrode when load is light, whereas a small forward bias voltage is applied when the load is heavy. The application of the bias voltage may be made switchable depending on the operation state or load state of the circuit by providing a control circuit. By controlling power consumption or TFT performance in such a way, circuit performance can be maximized.

This embodiment has described the example in which the conductive layer serving as an antenna is formed in the TFT layer; however, a structure may be employed, in which an antenna substrate provided with an antenna is bonded to the TFT layer to be electrically connected to each other, instead of forming the antenna in the TFT layer.

This embodiment can be freely combined with the embodiment mode described above or the other embodiments.

Embodiment 8

Embodiment 8 describes a manufacturing method of the gate electrode of the thin film transistor included in the TFT layer in Embodiment 1 with reference to FIGS. 18A, 18B, 19A and 19B.

A release layer 801 is formed over a substrate 800, and semiconductor films 811 and 812 are provided over the release layer 801 between insulating films 802 and 803 therebetween. The substrate 800 and the release layer 801 may be formed using the materials described in Embodiment 1. In addition, a gate insulating film 813 is formed over the semiconductor films 811 and 812. After that, a first conductive layer 821 and a second conductive layer 822 are stacked over the gate insulating film 813. In this embodiment, tantalum nitride (TaN) is used for the first conductive layer and tungsten (W) is used for the second conductive layer. The TaN film and the W film may be formed by a sputtering method. The TaN film may be formed by the sputtering method using a target of tantalum in a nitrogen atmosphere. The W film may be formed by the sputtering method using a target of tungsten.

In this embodiment, the first conductive layer 821 is made from TaN and the second conductive layer 822 is made from W. However, without being limited thereto, the first conductive layer 821 and the second conductive layer 822 may each be formed using an element selected from Ta, W, Ti, Mo, Al, Cu, Cr, and Nd; an alloy material or a compound material containing the element as its main component. Alternatively, a semiconductor film as typified by a polycrystalline silicon film, doped with an impurity element such as phosphorus, may be used. An AgPdCu alloy may be used. A combination thereof may also be appropriately selected. The first conductive layer 821 may be formed to have a thickness in the range of 20 to 100 nm. The second conductive layer 822 may be formed to have a thickness in the range of 100 to 400 nm. In this embodiment, the gate electrodes are formed to have a stacked structure of two layers. Alternatively, they may have a single-layer structure or a stacked structure of three or more layers.

Figure 18A:
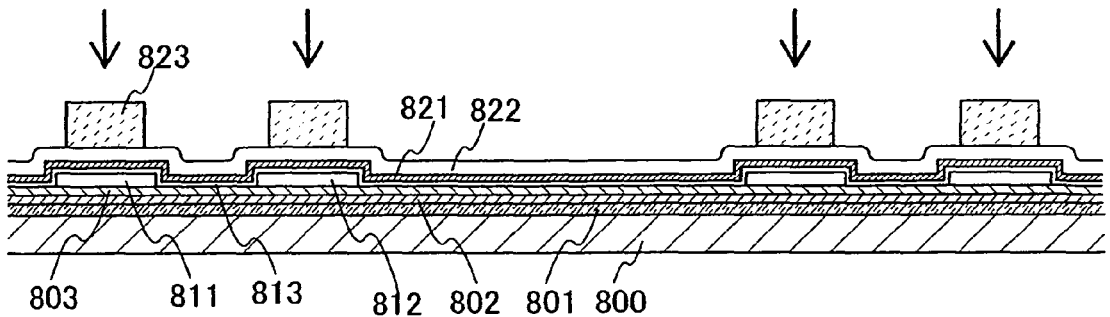
FIGS. 18A and 18B are each a drawing for explaining Embodiment 8.
Figure 18B:
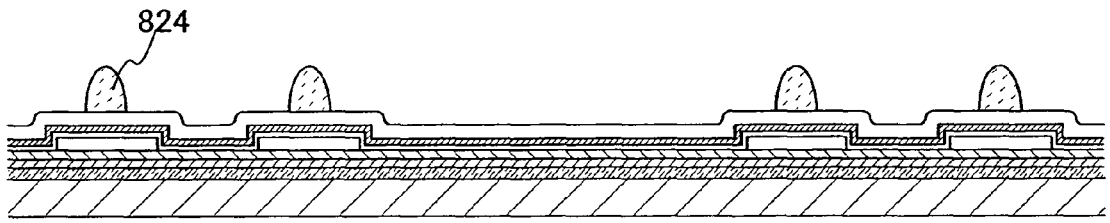

Then, a resist 823 is selectively formed over the second conductive layer 822 by photolithography or a droplet discharge method (FIG. 18A). Thereafter, the resist 823 is etched by a known etching treatment such as $O_2$ (oxygen) plasma treatment to reduce the size of the resist 823 (FIG. 18B). A gate electrode having a narrower width can be formed by etching the first conductive layer 821 and the second conductive layer 822 using the thus reduced resist 824 as a mask. In other words, a gate electrode narrower than one formed by using the resist 823 which is obtained by usual patterning can be formed. In such a way, the width of a channel forming region is reduced by decreasing the size of a gate electrode structure. Accordingly, high speed operation becomes possible.

A method for manufacturing a gate electrode, which is different from that shown in FIGS. 18A and 18B, will be explained with reference to FIGS. 19A and 19B.

Figure 19A:
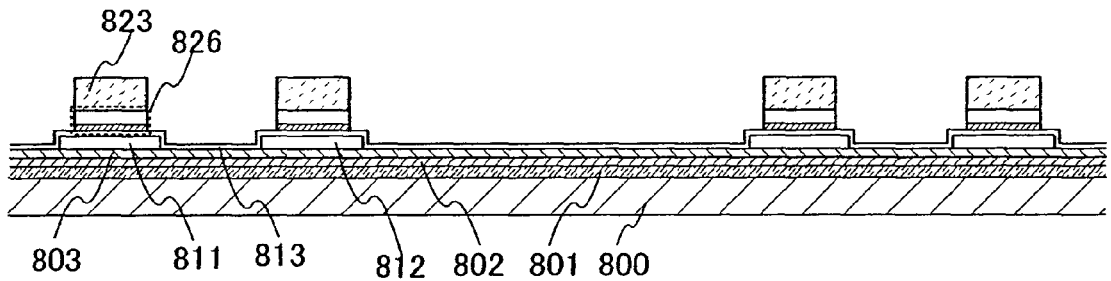
FIGS. 19A and 19B are each a drawing for explaining Embodiment 8.
Figure 19B:
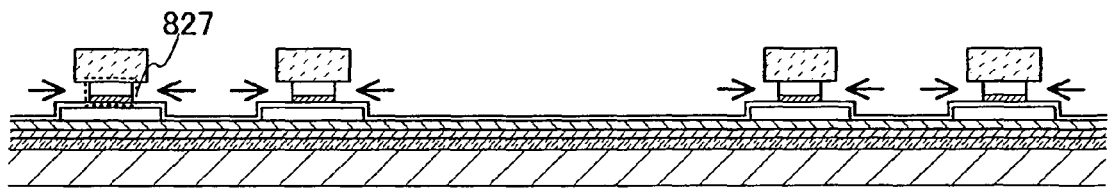

As shown in FIG. 19A, a release layer 801, insulating films 802 and 803, semiconductor films 811 and 812, a gate insulating film 813, a first conductive layer 821, and a second conductive layer 822 are stacked over a substrate 800. Then, a resist 823 is selectively formed. The first conductive layer 821 and the second conductive layer 822 are etched using the resist 823 as a mask (FIG. 19A). Through the steps, a gate electrode 826 including the first conductive layer 821 and the second conductive layer 822 is formed. Thereafter, the gate electrode 826 is etched by a known etching method. Since the resist 823 is provided over the gate electrode 826, each side face of the gate electrode 826 is etched; accordingly, a gate electrode 827 narrower than the gate electrode 826 can be formed as shown in FIG. 19B.

According to the manufacturing method described in this embodiment, a minute gate electrode that is finer than the finest one formed by patterning by a photolithography method or the like can be manufactured. Further, a minuter element structure can be provided by reducing the size of the gate electrode. Accordingly, more elements can be formed in a certain area, and a high-performance circuit can be formed. Thus, a smaller thin film integrated circuit (such as IC chip) can be obtained in the case where the thin film integrated circuit is formed with the same number of elements as the conventional one. The method shown in FIGS. 18A and 18B and the method shown in FIGS. 19A and 19B may be combined, so that a minuter gate electrode can be formed.

This embodiment has described the manufacturing method of the gate electrode in the thin film transistor having the TFT layer in Embodiment 1; however the gate electrode may be formed by a method combining freely Embodiment Mode described above and the other embodiments, without being limited to the method in Embodiment 1.

Embodiment 9

Embodiment 9 explains a circuit diagram of a wireless chip according to the present invention as one example with reference to the drawings. The specification of the wireless chip explained here meets ISO (International Organization for Standardization) Standards 15693, which is a vicinity type and whose communication signal frequency is 13.56 MHz. In addition, the reception responds only to a data readout instruction, the data transmission rate of the transmission is approximately 13 kHz, and a Manchester code is used as data coding.

Figure 20:
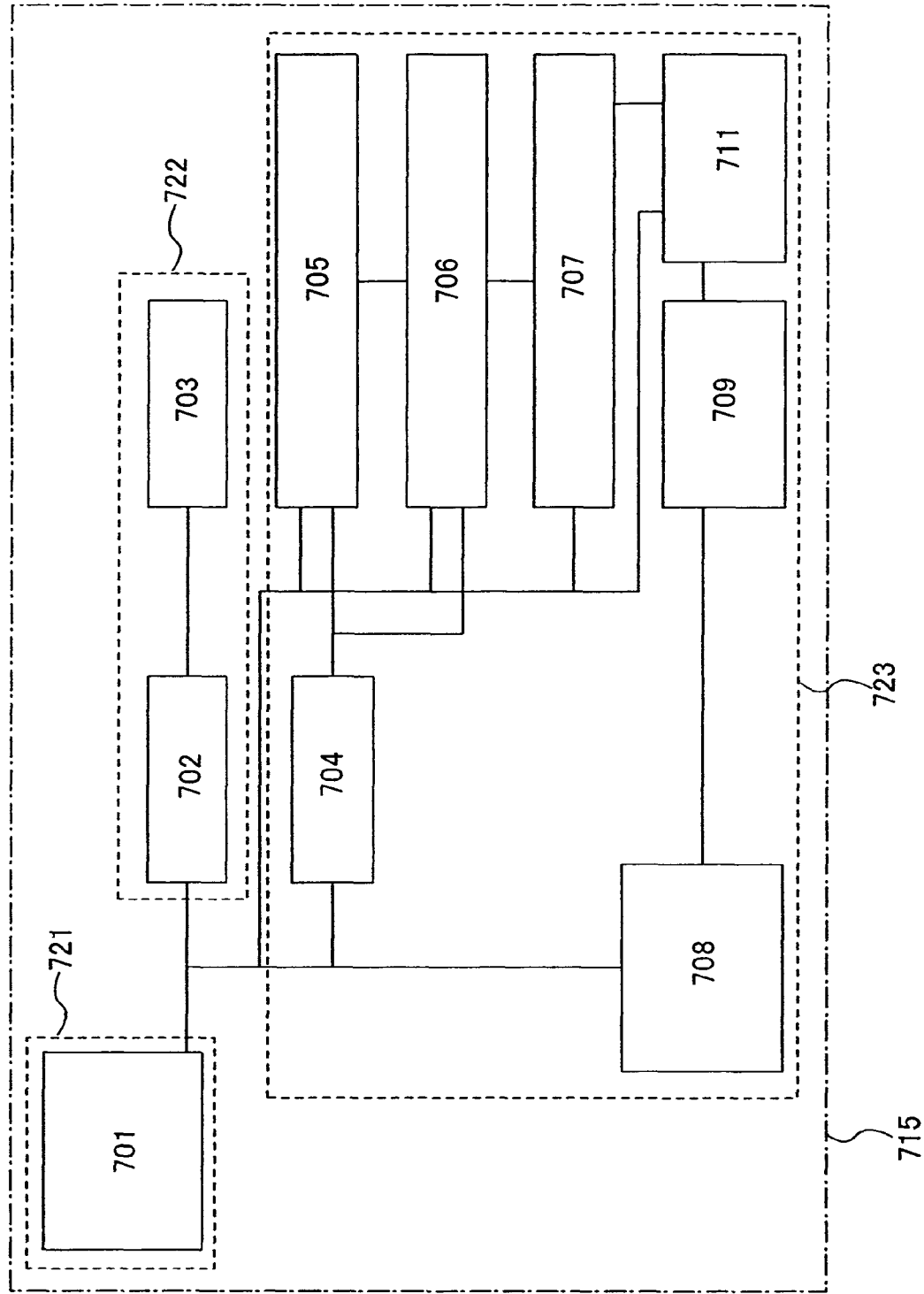
FIG. 20 is a drawing for explaining Embodiment 9.

A wireless chip 715 roughly includes an antenna portion 721, a power supply portion 722, and a logic portion 723. The antenna portion 721 includes an antenna 701 for receiving an external signal and transmitting data (FIG. 20). The power supply portion 722 includes a rectifier circuit 702 that generates voltage by a signal received from the outside via the antenna 701 and a storage capacitor 703 for storing the generated voltage. The logic portion 723 includes a demodulation circuit 704 for demodulating a received signal, a clock generation-correction circuit 705 for generating a clock signal, a circuit for recognizing and determining each code 706, a memory controller 707 that generates a signal for reading out data from a memory from the received signal, a modulation circuit including a modulation resistor 708 for modulating an encoded signal to a transmitted signal, an encoding circuit 709 for encoding the readout data, and a mask ROM 711 for holding data.

A code recognized and determining by the circuit for recognizing and determining each code 706 is an end of frame (EOF), a start of frame (SOF), a flag, a command code, a mask length, a mask value, or the like. In addition, the circuit for recognizing and determining each code 706 also includes cyclic redundancy check (CRC) function that identifies a transmission error.

Figure 21:
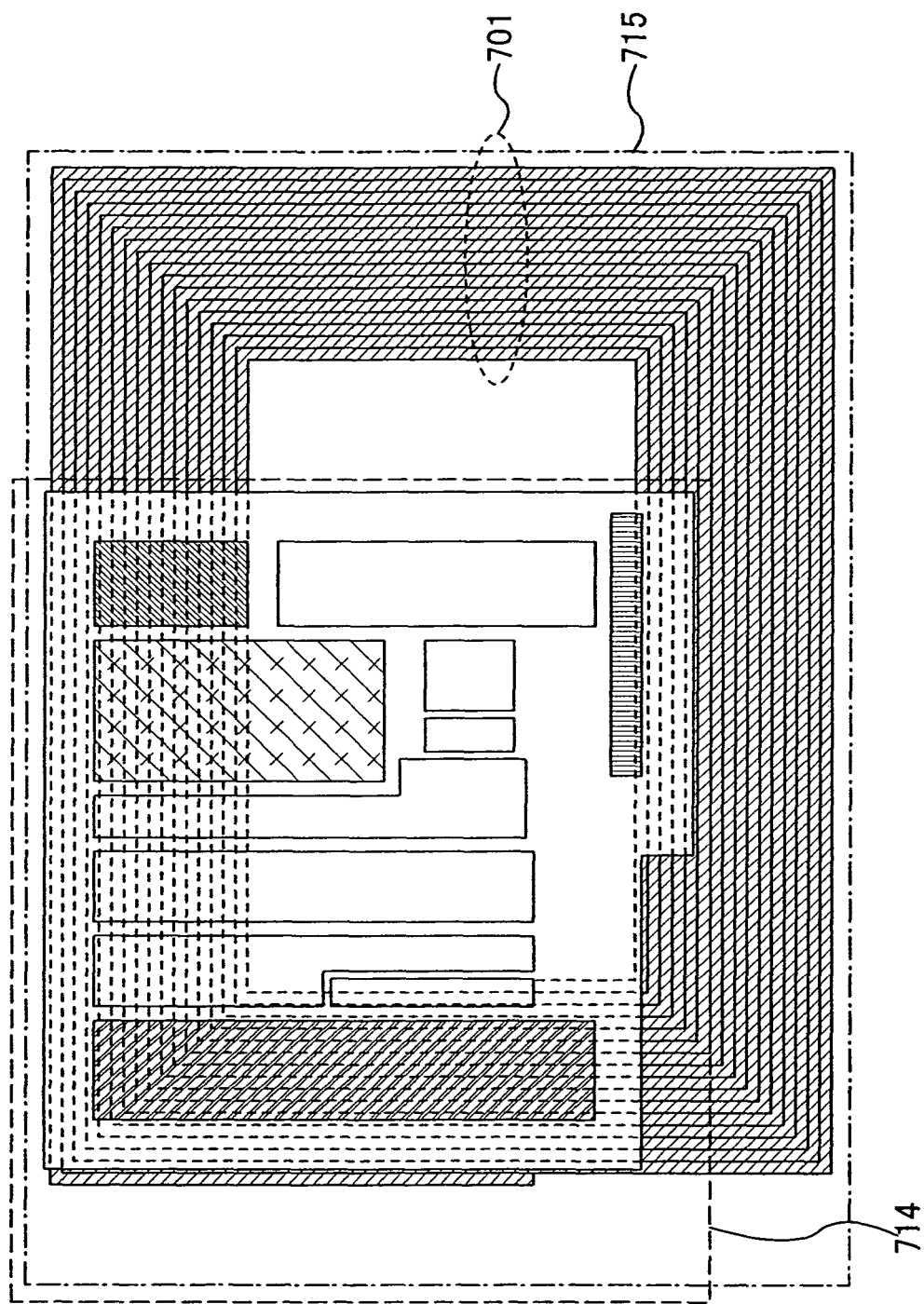
FIG. 21 is a drawing for explaining Embodiment 9.

Next, one example of the layout of the wireless chip having the above configuration is explained with reference to FIG. 21 and FIG. 22. First, an overall layout of one wireless chip is explained (FIG. 21). In the wireless chip, an antenna 701 and an element group 714 including the power supply portion 722 and the logic portion 723 are formed in layers at different levels, and specifically, the antenna 701 is formed on the element group 714. A part of the region where the element group 714 is formed is overlapped with a part of the region where the antenna 701 is formed. In the structure shown in FIG. 21, it is designed so that the width of wirings forming the antenna 701 is 150 μm and the width of the intervals between the wirings is 10 μm, and the number of windings is 15. Note that the present invention is not limited to the mode in which the antenna 701 and the element group 714 are formed in layers at different levels as mentioned above. In addition, the antenna 701 is not limited to the winding shape as shown in FIG. 21.

Figure 22:
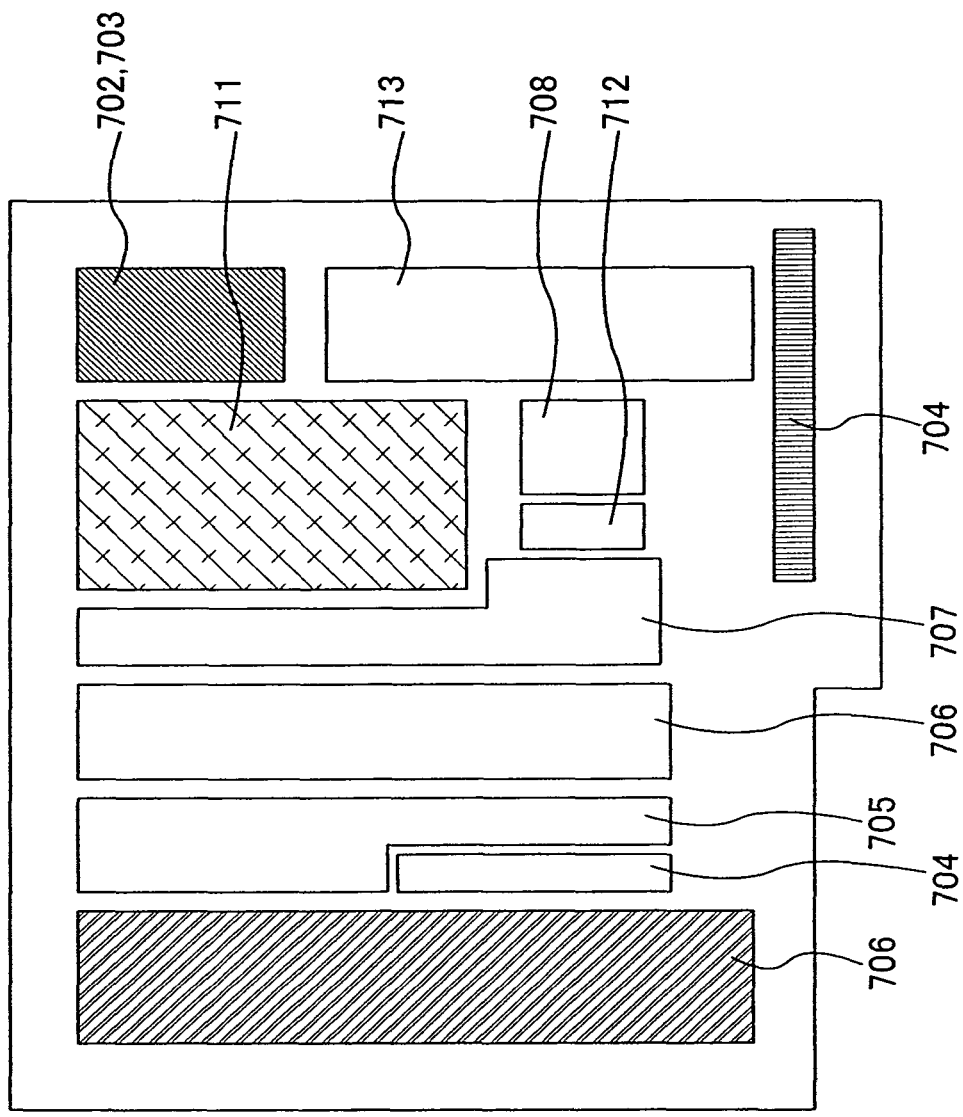
FIG. 22 is a drawing for explaining Embodiment 9.

Subsequently, the layouts of the power supply portion 722 and the logic portion 723 are explained (FIG. 22). The rectifier circuit 702 and the storage capacitor 703 included in the power supply portion 722 are provided in the same region. The demodulation circuit 704 and the circuit for recognizing and determining each code 706 included in the logic portion 723 are provided separately in two places. The mask ROM 711 and the memory controller 707 are provided adjacently. The clock generation-compensation circuit 705 and the circuit for recognizing and determining each code 706 are provided adjacently. The demodulation circuit 704 is provided between the clock generation-compensation circuit 705 and the circuit for recognizing and determining each code 706. In addition, although not shown in the block diagram of FIG. 20, a detection capacitor for a logic portion 712 and a detection capacitor for a power supply portion 713 are provided. The modulation circuit including a modulation resistor 708 is provided between the detection capacitors 712 and 713.

The mask ROM 711 forms memory content in a memory in the manufacturing process. Here, two power supply lines of a power supply line connected to a high-potential power supply (also referred to as VDD) and a power supply line connected to a low-potential power supply (also referred to as VSS) are provided, and the memory content stored by a memory cell is determined based on which of the above power supply lines a transistor included in each memory cell is connected to.

Figure 23A:
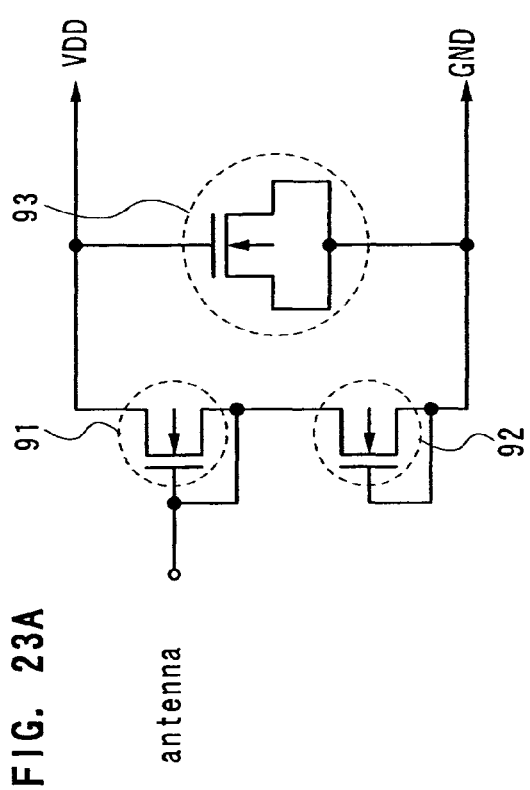
FIGS. 23A and 23B are each a drawing for explaining Embodiment 9.
Figure 23B:
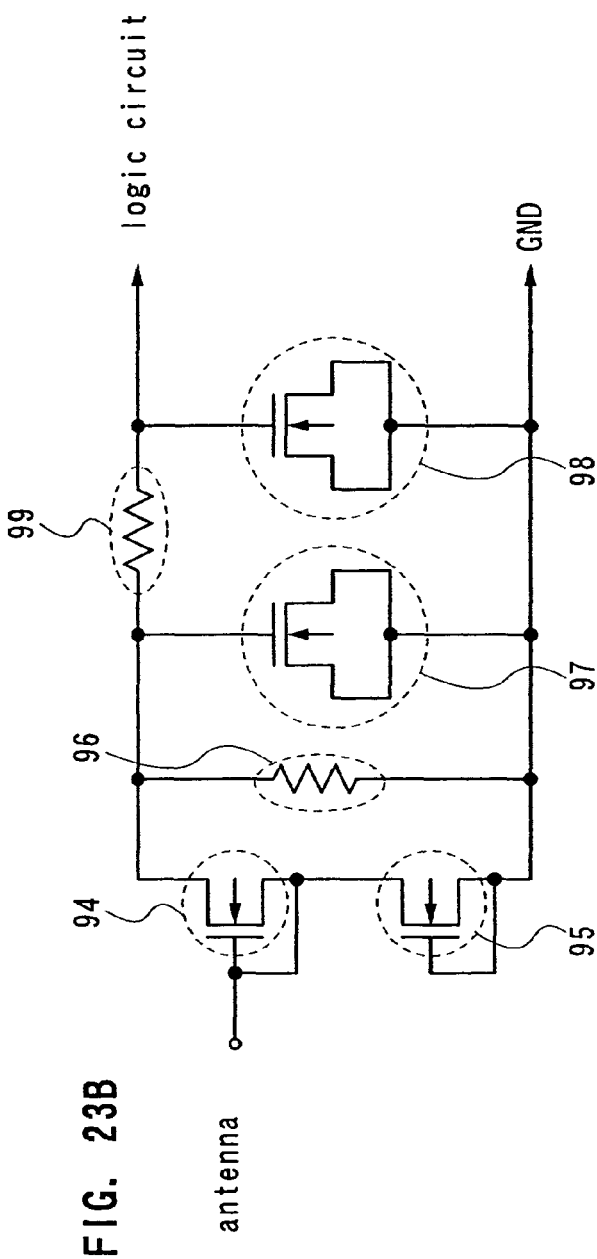

Then, one example of the circuit configuration of the rectifier circuit 702 is explained (FIG. 23A). The rectifier circuit 702 has transistors 91 and 92 and a capacitor transistor 93. The gate electrode of the transistor 91 is connected to an antenna 701. The gate electrode of the capacitor transistor 93 is connected to a high-potential power supply (VDD). In addition, the source and drain electrodes of the capacitor transistor 93 are connected to a ground power supply (GND). Subsequently, one example of the circuit configuration of the demodulation circuit 704 is explained (FIG. 23B). The demodulation circuit 704 has transistors 94 and 95, resistance elements 96 and 99, and capacitor transistors 97 and 98. The gate electrode of the transistor 94 is connected to the antenna 701. The gate electrode of the capacitor transistor 98 is connected to a logic circuit. The source and drain electrodes of the capacitor transistor 98 are connected to a ground power supply (GND).

Figure 24A:
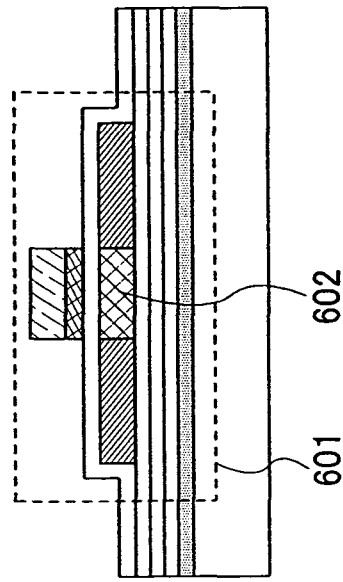
FIGS. 24A to 24D are each a drawing for explaining Embodiment 9.
Figure 24B:
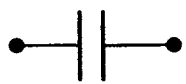
Figure 24C:
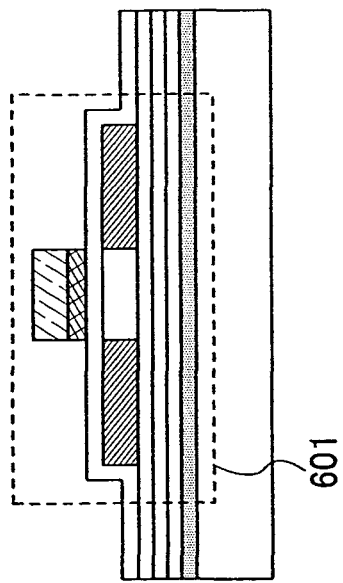
Figure 24D:
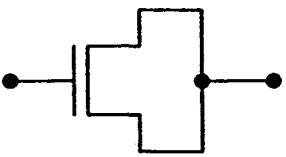

Then, the cross-sectional structure of a capacitor transistor included in the rectifier circuit 702 or the demodulation circuit 704 will be explained (FIG. 24A). The source and drain electrodes of a capacitor transistor 601 are connected to each other, and when the capacitor transistor 601 is turned ON, a capacitance is formed between the gate electrode and the channel forming region. The cross-sectional structure of the capacitor transistor 601 is the same as the cross-sectional structure of a usual thin film transistor. The equivalent circuit diagram thereof can be shown as in FIG. 24B. In the capacitance using a gate insulating film as in the above structure, it is influenced due to the fluctuation of the threshold voltage of the transistor; therefore, a region 602 overlapped with the gate electrode may be added with an impurity element (FIG. 24C). Accordingly, the capacitance is formed regardless of the threshold voltage of the transistor. The equivalent circuit diagram in this case can be shown as in FIG. 24D.

This embodiment can be freely combined with the embodiment mode described above or the other embodiments.

Embodiment 10

Embodiment 10 describes an example of using a crystalline semiconductor layer that is crystallized by laser irradiation, as the semiconductor layer of the thin film transistor included in the TFT layer.

A laser oscillator generating laser light is a continuous wave (CW) laser. The oscillator may employ one or plural types of CW lasers selected from a YAG laser, a $YVO_4$ laser, a YLF laser, a $YAlO_3$ laser, a glass laser, a ruby laser, an alexandrite laser, a Ti:sapphire laser, an excimer laser, an Ar laser, a Kr laser, and a $CO_2$ laser.

With such a CW laser, it is possible to manufacture a transistor using the polycrystalline semiconductor having few crystal defects and having a large crystal grain. Therefore, a liquid crystal display device can be provided, in which the mobility and the response speed are high, thus, the operation speed can be high, and operation frequency of an element can be increased. The high reliability can be obtained, because variations on characteristics are few.

For increasing the operation frequency much more, the scanning direction of laser light is preferably the same as a channel length direction of a transistor. This is because the highest mobility can be obtained when the channel length direction of the transistor and the scanning direction of laser light with respect to a substrate are almost parallel (preferably, from −30° to 30°) in a step of laser crystallization by such a CW laser. The channel length direction is the same as a flowing direction of current in the channel forming region, in other words, a direction in which an electric charge moves. The thusly formed transistor has an active layer including a polycrystalline semiconductor in which crystal grains are extended in the channel length direction, and this means that crystal grain boundaries are formed almost along the channel length direction.

The laser crystallization using a CW laser is described; however, the present invention is not limited to the CW laser, and a pulsed laser may be used for the crystallization. Even when energy beam (pulsed beam) is output in a pulsed oscillation, crystal grains continuously grown in the scanning direction can be obtained by emitting laser light with a repetition rate sufficient to emit the next pulsed beam before the semiconductor film is solidified after it has been melted by the laser light. In other words, even when a pulsed laser is adopted, the same effect as that of a CW laser can be obtained.

Therefore, a pulsed beam having a determined lower limit of the pulse repetition rate may be used so that the pulse period becomes shorter than the period since the semiconductor film is melted until it is solidified. Specifically, the repetition rate of a pulsed laser is 10 MHz or more, preferably 60 to 100 MHz. The repetition rate is much higher repetition rate than that of several tens to several hundreds Hz of a typically used pulsed beam.

When the pulsed laser light has the repetition rate of 10 MHz or more, it is possible to irradiate the semiconductor film with pulsed laser light before the semiconductor film is solidified after it has been melted by the previous laser light. Therefore, unlike the case of using a pulsed laser having a conventional repetition rate, the interface between the solid phase and the liquid phase can be moved continuously in the semiconductor film, and the semiconductor film having crystal grains grown continuously in the scanning direction can be formed. Specifically, it is possible to form an aggregation of crystal grains each of which has a width from 10 to 30 μm in the scanning direction and a width from approximately 1 to 5 μm in a direction perpendicular to the scanning direction. It is also possible to form a semiconductor film having almost no crystal grain boundaries at least in the channel length direction of a TFT by forming single crystal grains long extended along the scanning direction.

As the pulsed laser, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, or a gold vapor laser, which can oscillate in the above described repetition rate, can be used.

This embodiment can be freely combined with the embodiment mode described above or the other embodiments.

Embodiment 11

Embodiment 11 describes an example in which degradation speed of a thin film integrated circuit becomes faster when an atmosphere or a liquid outside films enters the inside of the films and is in contact with the thin film integrated circuit by breaking the films sealing the thin film integrated circuit, in a wireless chip having a hollow structure according to the present invention.

Figure 26:
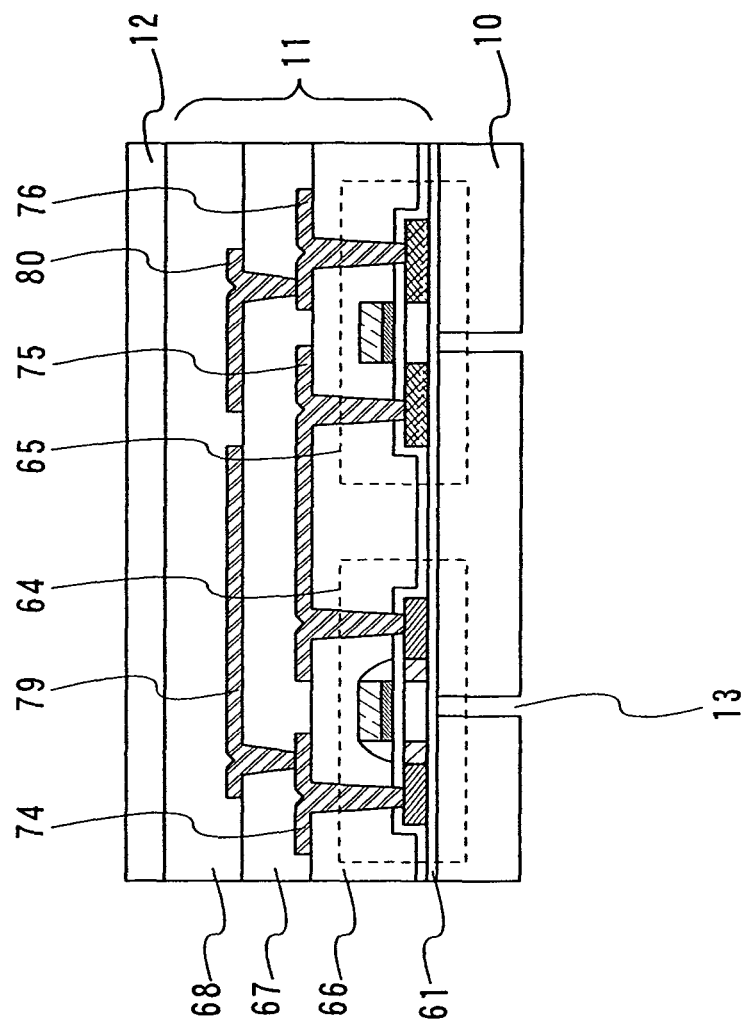
FIG. 26 is a drawing for explaining Embodiment 11.

FIG. 26 shows a cross-sectional view of the thin film integrated circuit manufactured according to Embodiment 3. An insulating film 61 serving as a base film is formed over a substrate 10. A plurality of elements are formed over the insulating film 61. The plurality of elements correspond to, for example, a plurality of elements selected from a thin film transistor, a capacitor element, a resistor element, a diode, and the like. FIG. 26 shows a cross-sectional structure of an N-channel thin film transistor 64 and a P-channel thin film transistor 65 that are formed as the plurality of elements. In FIG. 26, the thin film transistor 64 has an LDD (Lightly Doped Drain) structure including a channel forming region, and a lightly-doped impurity region, and a heavily-doped impurity region. The thin film transistor 65 has a single drain structure including a channel forming region and an impurity region. The structure of the thin film transistors is not limited to the above, and any structure, e.g., a single drain structure, an off-set structure, an LDD structure, a GOLD structure (Gate Overlapped Lightly Doped drain) may be employed. In this embodiment, the thin film transistors 64 and 65 are each a thin film transistor whose operation threshold value is shifted near the operation limit. In this manner, the degradation speed of the thin film integrated circuit becomes faster when an atmosphere or a liquid outside films enters the inside of the films and is in contact with the thin film integrated circuit by breaking the films sealing the thin film integrated circuit.

An insulating film 66 is formed to cover the thin film transistors 64 and 65, and source and drain wirings 74 to 76 electrically connected to impurity regions of the thin film transistors 64 and 65 are formed. An insulating film 67 is formed to cover the source and drain wirings 74 to 76. Conductive layers 79 and 80 electrically connected to the source and drain wirings 74 to 76 are formed over the insulating film 67. The conductive layers 79 and 80 function as an antenna. An insulating film 68 is formed to cover the conductive layers 79 and 80, and a third film 12 is formed over the insulating film 68. A portion from the insulating film 61 to the insulating film 68 corresponds to a TFT layer 11.

A hole 13 is formed in the substrate 10. One feature of the structure in FIG. 26 is that the hole 13 is formed in the substrate 10. By adopting such a structure, the thin film integrated circuit deteriorates faster, because an atmosphere or a liquid outside the films directly contact with the TFT layer 10 when the atmosphere or liquid outside the films enters the inside of the films by breaking the films sealing the thin film integrated circuit.

This embodiment can be freely combined with the embodiment mode described above or the other embodiments.

Embodiment 12

Embodiment 12 describes an example in which degradation speed of a thin film integrated circuit becomes faster when an atmosphere or a liquid outside films enters the inside of the films and is in contact with the thin film integrated circuit by breaking the films sealing the thin film integrated circuit, in a wireless chip having a hollow structure according to the present invention. The example is different from that in Embodiment 11.

Figure 27:
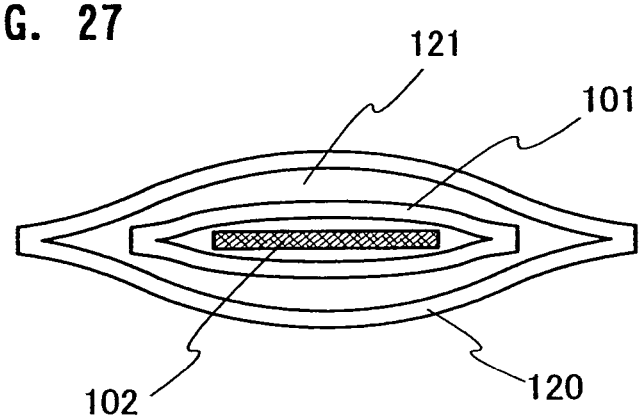
FIG. 27 is a drawing for explaining Embodiment 12.

As shown in FIG. 27, the first film sealing the thin film integrated circuit 102 is sealed by a second film 120, and a space 121 between the first film 101 and the second film 120 is filled with a gas, a liquid or a gel containing a substance promoting degradation of the thin film transistor included in the thin film integrated circuit. The first and second films may be thermoplastic resin. As an example of the thermoplastic resin used for the first and second films, the materials described in Embodiment Mode or Embodiments can be used.

Figure 28:
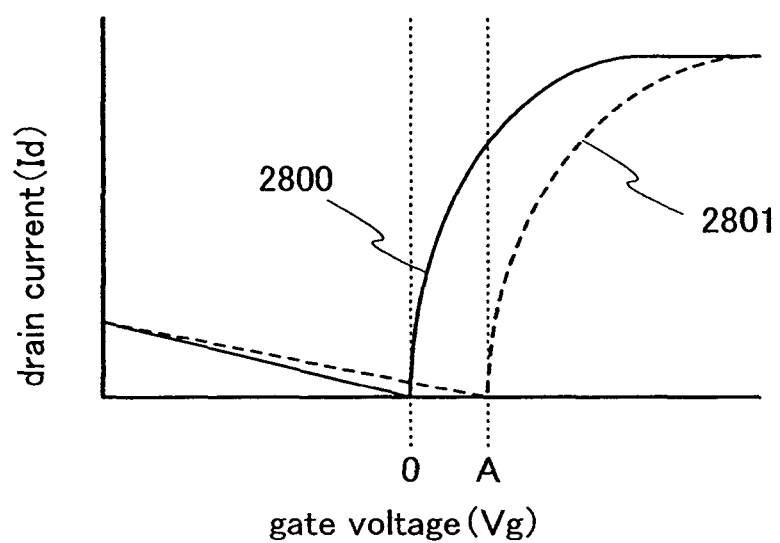
FIG. 28 is a graph showing a shift of electric characteristic of a thin film transistor.

As the substance promoting degradation of a thin film transistor, Na, K, ammonia, monoethanolamine, $H_2O$, SOX, $NO_x$ and the like are given. When a thin film transistor is exposed to a gas, a liquid or a gel containing the substance promoting degradation of the thin film transistor, the electric characteristic of the thin film transistor are shifted as shown in FIG. 28. In FIG. 28, the horizontal axis indicates a gate voltage (Vg) and the vertical axis indicates a drain current (Id). In addition, reference numeral 2800 denotes the electric characteristic of a thin film transistor before being exposed to a gas, a liquid or a gel containing a substance promoting degradation of the thin film transistor, while reference numeral 2801 denotes the electric characteristic of the thin film transistor after being exposed to the gas, the liquid or the gel containing a substance promoting degradation of the thin film transistor. The shift amount of the electric characteristic of the thin film transistor before and after being exposed to a gas, a liquid or a gel containing the substance promoting degradation of the thin film transistor corresponds to A in FIG. 28.

Figure 29:
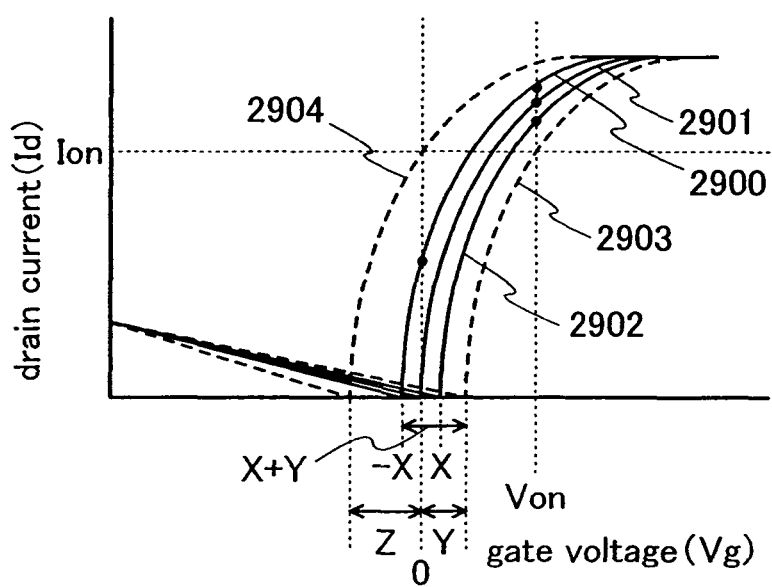
FIG. 29 is a graph showing variations on electric characteristics among thin film transistors.

In general, if thin film transistors are formed to have the same electric characteristics, slight variations in electric characteristics of the respective thin film transistors are generated as shown by 2900, 2901 and 2902 in FIG. 29. Here, the range of variations in the electric characteristics of the respective thin film transistors is expressed by ±x with the electric characteristic 2901 as a reference. In FIG. 29, the horizontal axis indicates a gate voltage (Vg) and the vertical axis indicates a drain current (Id). A drain current required for operating a thin film transistor is Ion, and a gate voltage applied to drive the thin film transistor is Von. In general, the drain current is set so that higher current value than Ion can be obtained by applying Von also in the electric characteristic 2903 which is assumed to be more shifted than the variation in electric characteristics of the respective thin film transistors to the direction of higher voltage. In addition, the drain current is set so that lower current value than Ion can be obtained by applying Vg=0 also in the electric characteristic 2904 which is assumed to be more shifted than the variation in electric characteristics of the respective thin film transistors to the direction of lower voltage. In other words, the electric characteristic 2903 and 2904 are operation limit electric characteristics. The shift amount of the electric characteristics 2903 and 2904 with respect to the electric characteristic 2901 are expressed by Y and Z, respectively. In FIG. 29, in the case of Vg=0, Id<Ion is obtained in the electric characteristics 2900, 2901, 2902 and 2903, and the thin film transistor does not operate, while, in the case of Vg=Von, Id>Ion is obtained in the electric characteristics 2900, 2901, 2902 and 2904. Therefore, when the variation on the electric characteristics is in the range of −Z or more and +Y or less, the thin film transistor can operate normally.

When the thin film transistor has the electric characteristic 2900, the electric characteristic 2900 may be shifted beyond the electric characteristic 2903 as the operation limit electric characteristic, so that the thin film transistor cannot operate at the time of Vg=Von, either. Herein, the shift amount of from the electric characteristic 2900 to the electric characteristic 2903 that is an operation limit electric characteristic is X+Y. Therefore, the electric characteristic may be shifted so that the shift amount thereof can be larger than X+Y in order to obtain a state in which the thin film transistor having the electric characteristic 2900 does not operate.

Figure 30:
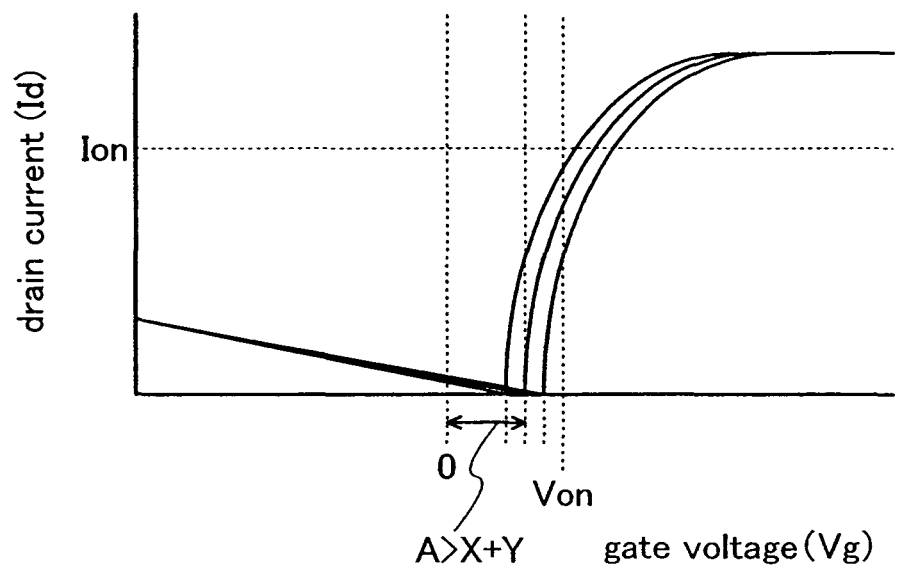
FIG. 30 is a graph showing electric characteristic of a thin film transistor after the thin film transistor is exposed to a substance promoting degradation of the thin film transistor.
Figure 31:
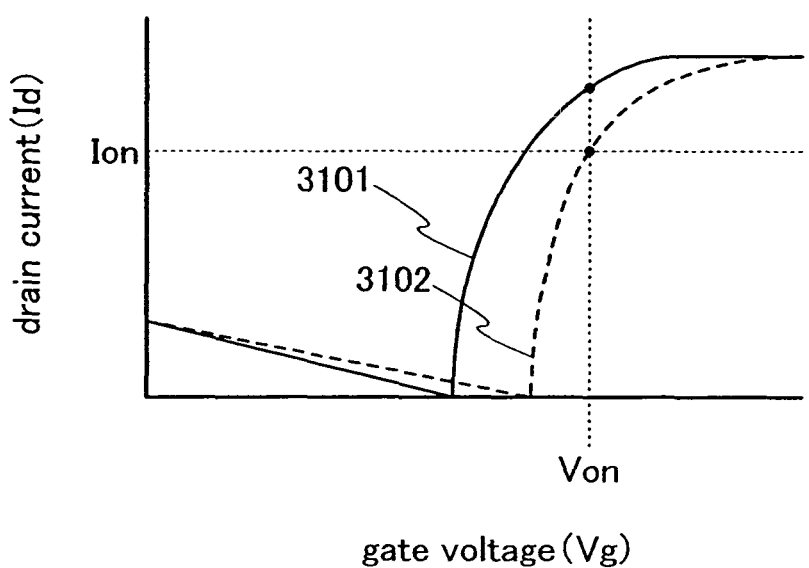
FIG. 31 is a graph showing a method of shifting an electric characteristic of a thin film transistor near the operation limit.

Thus, the concentration of a substance promoting degradation included in a gas, a liquid, or a gel existing in the space 121 between the first film and the second film is set so that the shift amount A in which the electric characteristic of the thin film transistor is shifted by being exposed to such a gas, a liquid, or a gel containing the substance promoting degradation of the thin film transistor is larger than X+Y, in which X is a range of variations on electric characteristics among the thin film transistors and Y is a shift amount of the operation limit electric characteristic. Then, by breaking the first film, the gas, the liquid, or the gel existing in the space 121 between the first film and the second film enters the inside of the first film. Thus, the thin film integrated circuit is exposed to the gas, the liquid, or the gel containing the substance promoting degradation of the thin film transistor; therefore, the electric characteristic of the thin film transistor included in the thin film integrated circuit is shifted to the state in FIG. 30 from that in FIG. 29. In FIG. 30, the horizontal axis indicates a gate voltage (Vg) and the vertical axis indicates a drain current (Id). As shown in FIG. 30, Id<Ion is obtained in either cases of Vg=0 and Vg=Von, and the thin film transistor included in the thin film integrated circuit is not operated constantly, which results in defective operation.

Embodiment has described the wireless chip having the structure in which a thin film integrated circuit is sealed by the first film and then the first film is surrounded by the second film. In other words, the wireless chip has the structure in which double films having a space therein are used to seal the thin film integrated circuit. However, triple or more films having a space therein may be used to seal the thin film integrated circuit.

Embodiment has described the wireless chip having the structure in which a thin film integrated circuit is sealed by the first film and then the first film is surrounded by the second film. However, the circuit sealed by the first film is not limited to only the thin film integrated circuit as long as it is an integrated circuit. For example, an integrated circuit formed on a semiconductor substrate or a thick film integrated circuit may be used. In addition, an integrated circuit in which an integrated circuit formed on a semiconductor substrate, a thick film integrated circuit and a thin film integrated circuit are mixed, may be used.

This embodiment can be freely combined with the embodiment mode described above or the other embodiments.

Embodiment 13

Figure 25:
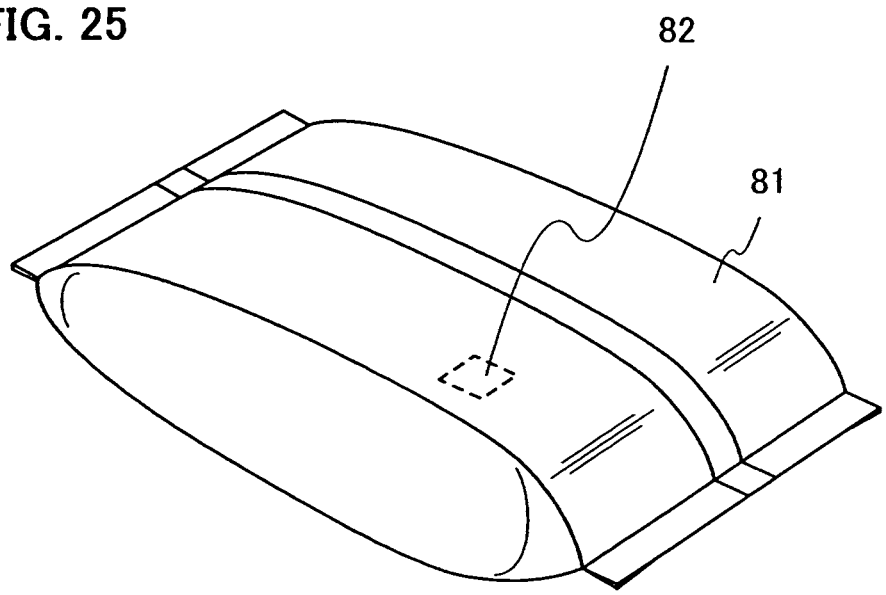
FIG. 25 is a drawing for explaining Embodiment 13.

Embodiment 13 describes applications of a wireless chip according to the present invention. As shown in FIG. 25, a wireless chip 82 according to the present invention is used with the wireless chip 82 put in a bag for packaging 81, for example. Since the wireless chip 82 according to the present invention has the structure in which the thin film integrated circuit is sealed by the films, the wireless chip can be directly put in the bag for packaging 81, like a desiccant put in the bag for packaging together with foods. In addition, the wireless chip can be put in a box (such as a cardboard box) together with products, without being limited to the bag for packaging. In this way, since the wireless chip is not required to be bonded and fixed on a product, there is not a risk that the wireless chip is peeled off. Thus, the step of bonding a wireless chip onto a product can be omitted.

This embodiment can be freely combined with the embodiment mode described above or the other embodiments.

What is claimed is:
1. An IC tag comprising:
   an integrated circuit over a first film, the integrated circuit having a first layer including thin film transistors over the first film and a second layer for securing strength on the first layer;
   an antenna connected to the integrated circuit; and
   a second film over the integrated circuit and the antenna,
   wherein a space is provided between the integrated circuit and the second film,
   wherein a first surface of the second film facing the integrated circuit has a convex portion,
   wherein the integrated circuit and the antenna are sealed with the first film and the second film by melting parts of the first film and the second film around the integrated circuit,
   wherein the integrated circuit is not fixed on the first film.

2. An IC tag comprising:
an integrated circuit over a first film, the integrated circuit having a first layer including thin film transistors over the first film and a second layer for securing strength on the first layer;
an antenna connected to the integrated circuit; and
a second film over the integrated circuit and the antenna,
wherein a space is provided between the integrated circuit and the second film,
wherein a first surface of the second film facing the integrated circuit has a convex portion,
wherein the integrated circuit and the antenna are sealed with the first film and the second film by melting parts of the first film and the second film around the integrated circuit, and
wherein the integrated circuit is able to move inside the first film and the second film.

3. The IC tag according to claim 1, wherein the second layer for securing strength comprises at least one of epoxy resin, acrylic resin, phenol resin, novolac resin, melamine resin, urethane resin, silicone resin, benzocyclobutene, parylene, flare, polyimide, photosensitive resin; siloxane polymer, a composition material containing a water-soluble homopolymer and a water-soluble copolymer; SiN, $SiO_2$, and SiON.

4. The IC tag according to claim 2, wherein the second layer for securing strength comprises at least one of epoxy resin, acrylic resin, phenol resin, novolac resin, melamine resin, urethane resin, silicone resin, benzocyclobutene, parylene, flare, polyimide, photosensitive resin; siloxane polymer, a composition material containing a water-soluble homopolymer and a water-soluble copolymer; SiN, $SiO_2$, and SiON.

5. The IC tag according to claim 1, wherein each of the first film and the second film comprises a thermoplastic resin.

6. The IC tag according to claim 2, wherein each of the first film and the second film comprises a thermoplastic resin.

7. The IC tag according to claim 1, wherein each of the first film and the second film comprises a biodegradable thermoplastic resin.

8. The IC tag according to claim 2, wherein each of the first film and the second film comprises a biodegradable thermoplastic resin.

9. The IC tag according to claim 1, wherein a first surface of the first film facing the integrated circuit has a convex portion.

10. The IC tag according to claim 1, wherein the antenna is located over the thin film transistors.

11. The IC tag according to claim 2, wherein a first surface of the first film facing the integrated circuit has a convex portion.

12. The IC tag according to claim 2, wherein the antenna is located over the thin film transistors.

13. The IC tag according to claim 1, wherein the space provided between the integrated circuit and the second film is filled with an inert gas.

14. The IC tag according to claim 2, wherein the space provided between the integrated circuit and the second film is filled with an inert gas.

* * * * *